(12) United States Patent
Fujii et al.

(10) Patent No.: US 9,082,971 B2
(45) Date of Patent: Jul. 14, 2015

(54) NONVOLATILE MEMORY DEVICE AND METHOD FOR MANUFACTURING THE SAME

(71) Applicant: Panasonic Corporation, Osaka (JP)

(72) Inventors: Satoru Fujii, Osaka (JP); Takumi Mikawa, Shiga (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 113 days.

(21) Appl. No.: 14/111,846

(22) PCT Filed: Feb. 13, 2013

(86) PCT No.: PCT/JP2013/000753
§ 371 (c)(1),
(2) Date: Oct. 15, 2013

(87) PCT Pub. No.: WO2013/125172
PCT Pub. Date: Aug. 29, 2013

(65) Prior Publication Data
US 2014/0225053 A1    Aug. 14, 2014

(30) Foreign Application Priority Data
Feb. 20, 2012   (JP) .................................. 2012-034464

(51) Int. Cl.
*H01L 45/00* (2006.01)
*H01L 27/24* (2006.01)
*C23C 16/40* (2006.01)

(52) U.S. Cl.
CPC ............ *H01L 45/145* (2013.01); *C23C 16/405* (2013.01); *H01L 27/2409* (2013.01);
(Continued)

(58) Field of Classification Search
CPC .......................... H01L 45/145; H01L 45/1616
See application file for complete search history.

(56) References Cited

U.S. PATENT DOCUMENTS 8,022,502 B2   9/2011   Kanzawa et al.
8,427,860 B2   4/2013   Ohba et al.
(Continued)

FOREIGN PATENT DOCUMENTS

JP         4253038      4/2009
JP       2009-218260    9/2009
(Continued)

OTHER PUBLICATIONS

International Search Report issued Apr. 2, 2013 in corresponding International Application No. PCT/JP2013/000753.
(Continued)

*Primary Examiner* — Matthew Reames
(74) *Attorney, Agent, or Firm* — Wenderoth, Lind & Ponack, L.L.P.

(57) ABSTRACT

A variable resistance layer includes a first variable resistance layer comprising a first metal oxide that is oxygen deficient and a second variable resistance layer comprising a second metal oxide having a degree of oxygen deficiency that is different from that of the first metal oxide, wherein the second variable resistance layer includes a non-metal element A that is different from oxygen, $x<(y+z)$ is satisfied where a composition of the first variable resistance layer is represented by $MO_x$ and a composition of the second variable resistance layer is represented by $NO_yA_z$, the second variable resistance layer has a higher resistivity than a resistivity of the first variable resistance layer, and a film density of the second variable resistance layer is lower than a theoretical film density of the second metal oxide which has a stoichiometric composition.

17 Claims, 13 Drawing Sheets

(52) U.S. Cl.
CPC ............ *H01L27/2463* (2013.01); *H01L 45/08* (2013.01); *H01L 45/1233* (2013.01); *H01L 45/146* (2013.01); *H01L 45/1616* (2013.01)

(56) References Cited

U.S. PATENT DOCUMENTS

| | | |
|---|---|---|
| 8,441,060 B2 | 5/2013 | Ninomiya et al. |
| 8,445,319 B2 | 5/2013 | Kanzawa et al. |
| 2009/0224224 A1 | 9/2009 | Fujii et al. |
| 2009/0283736 A1 | 11/2009 | Kanzawa et al. |
| 2010/0308298 A1 | 12/2010 | Ninomiya et al. |
| 2011/0194329 A1 | 8/2011 | Ohba et al. |
| 2011/0294259 A1 | 12/2011 | Kanzawa et al. |
| 2013/0009123 A1 | 1/2013 | Tada et al. |

FOREIGN PATENT DOCUMENTS

| | | |
|---|---|---|
| JP | 2011-187925 | 9/2011 |
| WO | 2008/059701 | 5/2008 |
| WO | 2008/149484 | 12/2008 |
| WO | 2009/157479 | 12/2009 |
| WO | 2010/038423 | 4/2010 |
| WO | 2011/115188 | 9/2011 |

OTHER PUBLICATIONS

I. G. Baek et al., "Highly Scalable Non-volatile Resistive Memory using Simple Binary Oxide Driven by Asymmetric Unipolar Voltage Pulses", 2004 IEEE International Electron Devices Meeting, IEDM Technical Digest, Dec. 13-15, 2004, pp. 587-590.

NONVOLATILE MEMORY DEVICE AND METHOD FOR MANUFACTURING THE SAME

TECHNICAL FIELD

The present invention relates to nonvolatile memory devices using variable resistance elements, and in particular relates to a nonvolatile memory device in which a stacked structure of variable resistance layers having different film densities is formed, and a method for manufacturing the nonvolatile memory device having such a structure.

BACKGROUND ART

With the progress of the digital technology of electronic devices in recent years, nonvolatile semiconductor memory devices with a large capacity have been actively developed for storing data, such as music, images, and information. For example, nonvolatile semiconductor memory devices which use ferroelectrics as capacity elements have already been used in many fields. Furthermore, compared with the nonvolatile memory device using a ferroelectric capacitor, a variable resistance nonvolatile semiconductor memory device (hereinafter referred to as ReRAM) using a variable resistance element in which a resistance value changes according to the application of an electric pulse and the state is maintained draws attention in that it is easy to ensure consistency with a normal semiconductor manufacturing process.

Here, Patent Literature 1 discloses a variable resistance element which comprises a first electrode layer, a variable resistance layer, and a second electrode layer. Here, the variable resistance layer comprises by stacking two tantalum oxide layers having different oxygen content atomic percentages. In other words, the variable resistance layer comprises a stacked structure of the first tantalum oxide layer and the second tantalum oxide layer, and the second tantalum oxide material layer comprised in the second tantalum oxide layer is higher than the first tantalum oxide material layer comprised in the first tantalum oxide layer in oxygen content atomic percentage. It is disclosed that the second tantalum oxide layer having a high oxygen content atomic percentage is formed through performing an oxygen plasma process on the first tantalum oxide layer.

Moreover, Non Patent Literature 1 discloses a nonvolatile memory device which includes a variable resistance element using two transition metal oxide layers in which a transition metal oxide as a material is formed. As the transition metal oxide, four types of NiO, TiO, $HfO_2$, and $ZrO_2$ are disclosed.

CITATION LIST

Patent Literature

[PTL 1]
WO2008/149484

Non Patent Literature

[NPL 1]
I. G. Baek at al., IEDM2004, p 587

SUMMARY OF INVENTION

Technical Problem

Among the variable resistance elements, there is a variable resistance element which requires the implementation of an initial breakdown operation of applying a high initial breakdown voltage once at the initial stage after manufacturing such that a layer comprising two tantalum oxide layers having different oxygen content atomic percentages functions as a variable resistance layer which changes between a high resistance state and a low resistance state. When the initial breakdown voltage is applied, among the two tantalum oxide layers, part of the tantalum oxide layer having a high oxygen content atomic percentage and having a high resistance value is locally shorted (broken and a conductive path is formed), and changes to a state in which a resistance change takes place. A voltage value of the above described initial breakdown voltage is generally greater than a voltage value of the voltage pulse applied for changing a resistance state in the variable resistance layer when the nonvolatile memory device performs a normal operation.

In Patent Literature 1, the second tantalum oxide layer having a high oxygen content atomic percentage is formed through the oxygen plasma process. In the oxygen plasma process, oxygen ions and the like are driven in from the film surface, and oxygen is dispersed in defects and between atoms. Therefore, in principle, the number of atoms comprised in a thin film is increased. As a result, the second tantalum oxide layer formed through the oxygen plasma process (metal oxide layer, second variable resistance layer) has few defects, is precise, and has a high film density. Therefore, the initial breakdown voltage applied at the time of the initial breakdown operation is high.

Meanwhile, when the metal oxide layer is formed through a film formation process such as a sputtering method, the number of defects in the film is higher than that formed through an oxygen plasma method. Therefore, although the initial breakdown voltage is reduced compared with that of the oxygen plasma process, there is a problem that reliability is decreased.

Therefore, the present invention has an object to reduce the initial breakdown voltage in a nonvolatile memory device which includes a variable resistance element which includes two metal oxide layers having different oxygen deficiencies, and to prevent reliability from decreasing.

Solution to Problem

In order to solve the above described problem, a nonvolatile memory device according to the present invention is a nonvolatile memory device comprising a variable resistance element which includes: an upper electrode layer; a lower electrode layer; and a variable resistance layer which is between the upper electrode layer and the lower electrode layer and has a resistance state which reversibly changes based on an electric pulse applied to between the upper electrode layer and the lower electrode layer and is maintained after the change, wherein the variable resistance layer includes a first variable resistance layer comprising a first metal oxide that is oxygen deficient and a second variable resistance layer comprising a second metal oxide having a degree of oxygen deficiency that is different from a degree of oxygen deficiency of the first metal oxide, the second variable resistance layer includes a non-metal element that is A and is different from oxygen, $x<(y+z)$ is satisfied where a first metal comprised in the first metal oxide is M, a second metal comprised in the second metal oxide is N, a composition of the first variable resistance layer is represented by $MO_x$, and a composition of the second variable resistance layer is represented by $NO_yA_z$, the second variable resistance layer has a higher resistivity than a resistivity of the first variable resistance layer, and a film density of the second variable resistance layer is lower than a theoretical film density of the second metal oxide which has a stoichiometric composition.

Advantageous Effects of Invention

With the nonvolatile memory device according to the present invention, the initial breakdown voltage can be reduced and a decrease in the reliability can be prevented. With a method for manufacturing the nonvolatile memory device according to the present invention, it is possible to manufacture a nonvolatile memory device in which the initial breakdown voltage can be reduced and a decrease in the reliability can be prevented.

Figure 1:
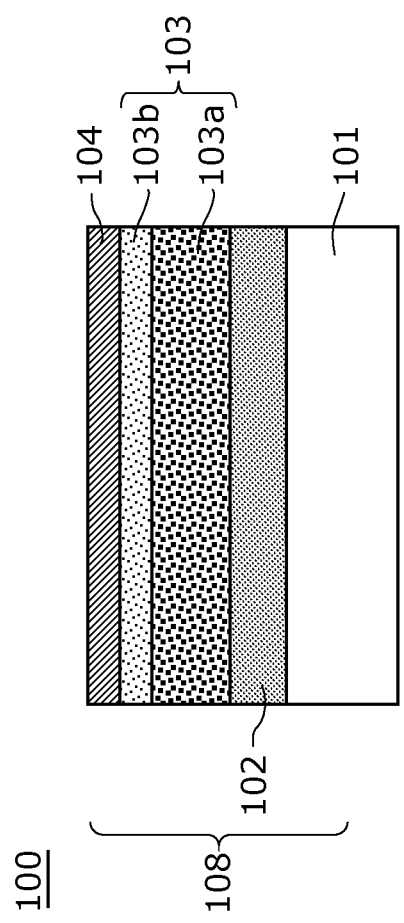
FIG. 1 is a cross-sectional view showing an example of a configuration of a variable resistance nonvolatile memory device according to Embodiment 1.

DESCRIPTION OF EMBODIMENTS (Outline of Nonvolatile Memory Device and a Method for Manufacturing Nonvolatile Memory Device According to Present Embodiment)

The nonvolatile memory device according to the present embodiment is a nonvolatile memory device according to the present invention is a nonvolatile memory device comprising a variable resistance element which includes: an upper electrode layer; a lower electrode layer; and a variable resistance layer which is between the upper electrode layer and the lower electrode layer and has a resistance state which reversibly changes based on an electric pulse applied to between the upper electrode layer and the lower electrode layer and is maintained after the change, wherein the variable resistance layer includes a first variable resistance layer comprising a first metal oxide that is oxygen deficient and a second variable resistance layer comprising a second metal oxide having a degree of oxygen deficiency that is different from a degree of oxygen deficiency of the first metal oxide, the second variable resistance layer includes a non-metal element that is A and is different from oxygen, x<(y+z) is satisfied where a first metal comprised in the first metal oxide is M, a second metal comprised in the second metal oxide is N, a composition of the first variable resistance layer is represented by $MO_x$, and a composition of the second variable resistance layer is represented by $NO_yA_z$, the second variable resistance layer has a higher resistivity than a resistivity of the first variable resistance layer, and a film density of the second variable resistance layer is lower than a theoretical film density of the second metal oxide which has a stoichiometric composition.

The nonvolatile memory device with the above configuration comprises a stacked structure of the first variable resistance layer composed of an oxygen-deficient metal oxide and the second variable resistance layer having a resistance value greater than that of the first variable resistance layer. Since the second variable resistance layer comprises to include a non-metal element that is A and is different from oxygen, the number of defects in the second variable resistance layer is increased, and by setting the defect as a starting point, the conductive path (filament) can be formed at a voltage that is lower than before, with the result that the initial breakdown voltage of the variable resistance element can be reduced.

Moreover, the non-metal element may have a larger atomic radius than an atomic radius of oxygen.

Moreover, the non-metal element may have a smaller atomic weight than an atomic weight of oxygen.

By replacing part of oxygen included in the second variable resistance layer with the non-metal element A having an atomic weight smaller than oxygen, the film density of the second variable resistance layer can be lower than the theoretical film density of the metal oxide having a stoichiometric composition. As described above, when the film density of the second variable resistance layer is lower, the initial breakdown voltage is lower. Therefore, by making the film density of the second variable resistance layer lower than the theoretical film density of the metal oxide having a stoichiometric composition, the initial breakdown voltage can be reduced compared with the case where the second variable resistance layer comprises a metal oxide having a stoichiometric composition.

Moreover, the non-metal element may be any one of boron, nitrogen, and carbon.

By replacing part of oxygen with one of the elements of boron, nitrogen, and carbon each having an atomic weight smaller than oxygen, the film density of the second variable resistance layer can be lower than the theoretical film density of the metal oxide of stoichiometric composition. With this, since the conductive path in the second variable resistance layer can be formed at a voltage that is lower than before, a decrease in the initial breakdown voltage in the variable resistance element can be realized.

Moreover, the non-metal element is carbon, and a carbon content atomic percentage of the second variable resistance layer may be no less than 2 [atm %] and no more than 45 [atm %].

With this, the film density of the second variable resistance layer can be lower than the theoretical film density of the metal oxide having a stoichiometric composition. With this, since the conductive path in the second variable resistance layer can be formed at a voltage that is lower than before, a decrease in the initial breakdown voltage in the variable resistance element can be realized.

Moreover, the second variable resistance layer may have a film density of no less than 4 $[g/cm^3]$ and no more than 7 $[g/cm^3]$.

The film density of the second variable resistance layer and the initial breakdown voltage has a relationship in which the initial breakdown voltage is lower when the film density of the second variable resistance layer is lower. By setting the film density in a range from no less than 4 $[g/cm^3]$ to no more than 7 $[g/cm^3]$, the initial breakdown voltage can be effectively reduced.

Moreover, the first metal oxide may be a transition metal oxide or an aluminum oxide. The first metal oxide may be a tantalum oxide.

With this, using the conventional semiconductor process, a nonvolatile memory device capable of performing a stable operation can be realized.

Moreover, the first metal and the second metal may be a same metal, and the first metal and the second metal may be different metals Moreover, the nonvolatile memory device may further comprise a non-ohmic element which includes a first electrode layer, a semiconductor layer formed above the first electrode layer, and a second electrode layer formed above the semiconductor layer, wherein the lower electrode layer or the upper electrode layer of the variable resistance element may be in direct contact with the first electrode layer or the second electrode layer of the non-ohmic element.

By being configured such that the electrode layer of the non-ohmic element having current on-off characteristics and the electrode layer of the variable resistance layer are in direct contact with each other, when a plurality of variable resistance elements are included, a leakage current flowing to unselected variable resistance elements can be reduced and a stable operation can be realized.

A method for manufacturing the nonvolatile memory device according to the present embodiment is a method for manufacturing a nonvolatile memory device which includes a variable resistance element which includes a variable resistance layer in which a resistance state changes according to application of an electric pulse and the changed resistance state is maintained, the method comprising forming an element which includes: (a) forming a lower electrode layer; forming the variable resistance layer above the lower electrode layer; and (d) forming an upper electrode layer above the variable resistance layer, wherein the forming of the variable resistance layer includes: (b) forming a first variable resistance layer comprising a first metal oxide that is oxygen deficient; and (c) forming a second variable resistance layer which comprises a second metal oxide having a degree of oxygen deficiency that is different from a degree of oxygen deficiency of the first metal oxide, includes a non-metal element that is A and is different from oxygen, satisfies x<(y+z) where a first metal comprised in the first metal oxide is M, a second metal comprised in the second metal oxide is N, a composition of the first variable resistance layer is represented by $MO_x$, and a composition of the second variable resistance layer is represented by $NO_yA_z$, has a higher resistivity than a resistivity of the first variable resistance layer, and has a film density lower than a theoretical film density of the second metal oxide which has a stoichiometric composition.

When the nonvolatile memory device is manufactured according to this method, the non-metal element A can be included in the second variable resistance layer, and the number of defects in the second variable resistance layer is increased. By setting the defects as a starting point, the conductive path in the second variable resistance layer can be formed at a voltage that is lower than before, with the result that the initial breakdown voltage can be reduced.

Moreover, the method for manufacturing a nonvolatile memory device may further comprise forming a non-ohmic element which includes: (e) forming a first electrode layer; (f) forming a semiconductor layer or an insulating layer above the first electrode layer; and (g) forming a second electrode layer above the semiconductor layer or the insulating layer, wherein the forming of a non-ohmic element may be performed before or after the forming of an element.

With this, in the case of forming a plurality of variable resistance elements, since (i) the electrode of the variable resistance element in which the initial breakdown voltage is decreased by including the non-metal element A and (ii) the electrode of the non-ohmic element can be formed to be in direct contact with each other, the current flowing to the unselected element can be reduced and a stable operation of the memory device can be realized.

Moreover, the method for manufacturing a nonvolatile memory device may further comprise preprocessing which includes: (h) forming a plurality of lower electrode lines extending in a first direction; (i) forming an interlayer dielectric above the lower electrode lines; and (j) forming contact holes each of which reaches one of the lower electrode lines, the contact holes each being at a location which is in the interlayer dielectric and corresponds to one of crossings of a plurality of upper electrode lines extending in a second direction crossing the first direction and the lower electrode lines, wherein after the preprocessing, the lower electrode layer of the variable resistance element may be embedded and formed in the contact hole.

Moreover, in step (c), the second variable resistance layer may be formed according to a CVD method or an ALD method.

By forming according to the chemical vapor deposition (CVD) method or the atomic layer deposition (ALD) method, the non-metal element A can be included in the second variable resistance layer with a good condition.

Moreover, the first metal and the second metal may be the same metal, and the first metal and the second metal may be different metals.

(Explanation of Terms and the Like)

In the embodiments, the term "oxygen content atomic percentage" refers to the ratio of the number of oxygen atoms to the total number of atoms comprised in a metal oxide. For instance, an oxygen content atomic percentage of $Ta_2O_5$ is calculated according to a ratio of the number of oxygen atoms to the total number of atoms (O/(Ta+O)), that is, 71.4 atm %. Thus, an oxygen-deficient tantalum oxide has an oxygen content atomic percentage from more than 0 to less than 71.4 atm %. For example, when a metal comprised in the first metal oxide layer and a metal comprised in the second metal oxide layer are the same type, an oxygen content atomic percentage has a correspondence relationship with a degree of oxygen deficiency. In other words, when the second metal oxide has an oxygen content atomic percentage greater than that of the first metal oxide, the second metal oxide has a degree of oxygen deficiency lower than that of the first metal oxide.

The term "degree of oxygen deficiency" refers to a proportion of deficient oxygen to an amount of oxygen of an oxide having a stoichiometric composition (a stoichiometric composition having the highest resistance value when stoichiometric compositions are present) in a metal oxide exists. A metal oxide having a stoichiometric composition has a resistance value that is more stable and higher than those of metal oxides having other compositions.

For example, when a metal is tantalum (Ta), an oxide having a stoichiometric composition according to the above definition is $Ta_2O_5$, which can be expressed as $TaO_{2.5}$. A degree of oxygen deficiency of $TaO_{2.5}$ is 0%. A degree of oxygen deficiency of $TaO_{1.5}$ is calculated as a degree of oxygen deficiency=(2.5-1.5)/2.5=40%. Moreover, an oxygen-rich metal oxide has a negative value of a degree of oxygen deficiency. It is to be noted that in the Description, unless otherwise specifically noted, the degree of oxygen deficiency includes a positive value, 0, and a negative value.

An oxide having a low degree of oxygen deficiency has a high resistance value because such an oxide is more similar to an oxide having a stoichiometric composition, and an oxide having a high degree of oxygen deficiency has a low resistance value because such an oxide is more similar to a metal included in an oxide.

The term "oxygen-deficient metal oxide" means a metal oxide that is lower in oxygen content (atom ratio:the ratio of the number of oxygen atoms to the total number of atoms) than a metal oxide having a stoichiometric composition.

The term "metal oxide having a stoichiometric composition" refers to a metal oxide having a degree of oxygen deficiency of 0%. For example, in the case of a tantalum oxide, it refers to $Ta_2O_5$ that is an insulator. It should be noted that the metal oxide, when becoming oxygen-deficient, has conductivity.

The term "standard electrode potential" refers to an indicator of a degree of being easily oxidized. The standard electrode potential having a larger value represents a property of being more difficult to be oxidized, and the standard electrode potential having a smaller value represents a property of being easier to be oxidized. It should be noted that when the difference in standard electrode potential between the electrode and the low oxygen deficient layer (the second variable resistance layer) is greater, the oxidation-reduction reaction is easier to occur and a resistance change is easier to occur. Moreover, when the difference in standard electrode potential is smaller, the oxidation-reduction reaction is more difficult to occur. This can be taken to mean that the ease of oxidation plays a major role in a mechanism of the resistance change phenomenon.

The term "initial resistance value" refers to a resistance value of the variable resistance element when a conductive path is not formed in the second variable resistance layer before the initial breakdown operation is performed. The value is larger than the resistance value which corresponds to the high resistance state changing between the low resistance state and the high resistance state after the initial breakdown operation.

The following will describe embodiments of the nonvolatile memory device with reference to the drawings. Each of the embodiments described below shows a general or specific example. The numerical values, shapes, materials, constituent elements, the arrangement and connection of the constituent elements, steps, the processing order of the steps, etc. shown in the following embodiments are mere examples, and therefore do not limit the scope of the present invention. Therefore, among the structural elements in the following embodiments, structural elements not recited in any one of the independent claims are described as arbitrary structural elements.

Embodiment 1

A nonvolatile memory device and a method for manufacturing the nonvolatile memory device will be described with reference to FIGS. 1 to 5.

(Configuration of Nonvolatile Memory Device 100 According to Embodiment 1)

First, the configuration of a nonvolatile memory device 100 according to the present embodiment will be described with reference to FIG. 1. Here, FIG. 1 is a cross-sectional view showing an example of the configuration of the variable resistance nonvolatile memory device 100 according to the present embodiment.

As shown in FIG. 1, the nonvolatile memory device 100 comprises a variable resistance element 108 which includes a lower electrode layer 102 formed above a substrate 101, a variable resistance layer 103 formed above the lower electrode layer 102, and an upper electrode layer 104 formed above the variable resistance layer 103.

It should be noted that the nonvolatile memory device comprises the variable resistance element 108. In other words, although the substrate 101 is not a necessary component of the present invention, it is described as a component comprised in a more favorable embodiment. Moreover, although in the embodiment, the variable resistance element 108 is formed above the substrate 101, the configuration is not limited to such. For example, it is acceptable that a semiconductor circuit layer such as an integrated circuit is formed above the substrate 101 and the variable resistance element 108 is formed above the semiconductor circuit layer.

More specifically, the lower electrode layer 102 comprises a lower electrode material having a standard electrode potential that is lower than that of the upper electrode layer 104 to be described later. It is assumed that the lower electrode material is tantalum nitride (TaN) in the present embodiment. Although it is assumed that the lower electrode material in the present embodiment is tantalum nitride (TaN), the material is not limited to such. For example, a metal including at lease one selected from copper (Cu), titanium (Ti), tungsten (W), tantalum (Ta), and their respective nitrides is favorable.

The variable resistance layer 103 is between the lower electrode layer 102 and the upper electrode layer 104, and is a layer having a resistance value which reversibly changes according to an electrical signal provided to between the lower electrode layer 102 and the upper electrode layer 104. The variable resistance layer 103, for example, is a layer which reversibly changes between the high resistance state and the low resistance state according to a polarity of a voltage applied to between the lower electrode layer 102 and the upper electrode layer 104. The variable resistance layer 103 comprises by stacking at least two layers of a first variable resistance layer 103a connected to the lower electrode layer 102 and a second variable resistance layer 103b connected to the upper electrode layer 104.

More specifically, the variable resistance layer 103, in the present embodiment, comprises by stacking, in that order, the first variable resistance layer 103a comprising the oxygen-deficient first metal oxide and the second variable resistance layer 103b which includes the non-metal element A other than oxygen and comprises the second metal oxide having a degree of oxygen deficiency that is different from that of the first metal oxide. The first metal and the second metal may comprise the same material and a material that is different from each other. As the first metal and the second metal, for example, (i) a transition metal such as tantalum (Ta), hafnium (Hf), zirconium (zr), nickel (Ni), titanium (Ti), vanadium (V), cobalt (Co), zinc (zn), niobium (Nb), and tungsten (W), or (ii) aluminum (Al) may be used.

Here, when the composition of the first variable resistance layer 103a is represented by $MO_x$ and the composition of the second variable resistance layer 103b is represented by $NO_yA_z$, it can be expressed as $x<(y+z)$.

Furthermore, the resistivity of the second variable resistance layer 103b is set to be greater than the resistivity of the first variable resistance layer 103a. By designing the resistivity of the second variable resistance layer to be higher than the resistivity of the first variable resistance layer, a large voltage is applied to the second variable resistance layer when a voltage is applied at the time of a normal write process. With this, the oxidation-reduction reaction is likely to occur in an adjacent region of an interface with the upper electrode layer in the second variable resistance layer. As a result, a resistance change phenomenon is easier to occur, and a variable resistance element that is capable of driving at a low voltage can be obtained.

Moreover, the film density of the second variable resistance layer is smaller than the theoretical film density of a metal oxide having a stoichiometric composition.

More specifically, it is assumed that the first metal oxide comprised in the first variable resistance layer 103a, in the present embodiment, is oxygen-deficient tantalum oxide (TaOx). The oxygen content atomic percentage of the first variable resistance layer 103a is set to 50 [atm %] to 65 [atm %], for example.

It is assumed that the second metal oxide comprised in the second variable resistance layer 103b, in the present embodiment, is oxygen-deficient tantalum oxide ($TaO_yA_z$) that includes the non-metal element A. Moreover, the content percentage which totals oxygen of the second variable resistance layer 103b and the non-metal element A ($(y+z)/(1+y+z)$) is set to 65 to 80 [atm %]. Here, in the case of the tantalum oxide, in the stoichiometric composition, the oxygen content atomic percentage is 71.4% ($Ta_2O_5$). However, it is also assumed that oxygen and the non-metal element A are excessively included in the film of the second variable resistance layer 103b. As the non-metal element A, for example, carbon can be used.

It should be noted by using oxygen-deficient tantalum oxide as the first metal oxide and the second metal oxide, a resistance change phenomenon that is reversible and stable can be obtained. This is described as a relevant patent in detail in WO2008/059701 (Patent Literature). Moreover, a configuration to be stacked in two layers is described in detail in Japanese Patent No. 4253038 (Patent Literature).

The upper electrode layer 104 comprises an upper electrode material having a standard electrode potential that is higher than that of the above described lower electrode layer 102. In the present embodiment, iridium (Ir) can be used as the upper electrode material. It should be noted that the upper electrode material is not limited to such. For example, precious metal such as platinum (Pt) or palladium (Pd) may be used.

Here, the standard electrode potential for each of platinum and iridium is no less than 1.0 [eV]. Since the standard electrode potential of tantalum is −0.6 [eV], the variable resistance layer 103 is lower than the upper electrode in standard electrode potential. From this, it is estimated that the oxidation-reduction reaction occurs at the interface between the upper electrode layer 104 in the second variable resistance layer 103b and the second variable resistance layer 103b, oxygen is provided and accepted, and a resistance change phenomenon appears.

(Method for Manufacturing Nonvolatile Memory Device 100 According to Embodiment 1)

Next, a method for manufacturing the nonvolatile memory device according to the present embodiment will be described.

First, above the substrate 101 such as a silicon (Si) wafer, the lower electrode material is deposited and the lower electrode layer 102 is formed according to a sputtering method (corresponding to the first step). In the present embodiment, tantalum nitride film is formed. The tantalum nitride film, in the present embodiment, is formed according to a reactive sputtering method in a nitride gas atmosphere using Ta target by setting, for example, the chamber pressure to 0.03 [Pa] to 3 [Pa] and setting the Ar/$N_2$ flow rate to 20 [sccm]/5 [sccm] to 20 [sccm]/30 [sccm].

Next, according to the reactive sputtering method, above the lower electrode layer 102, $TaO_x$ film is deposited as an example of the first metal oxide, and then the first variable resistance layer 103a is formed (corresponding to the second step). The TaOx film, in the present embodiment, is formed in an oxygen gas atmosphere using Ta target by setting, for example, as a room temperature condition, the chamber pressure 0.03 [Pa] to 3 [Pa], and the Ar/$N_2$ flow rate to [sccm]/5 [sccm] to 20 [sccm]/30 [sccm]. It should be noted that as a method for forming film of the first variable resistance layer 103a, not only the sputtering method but also the CVD method and the ALD method may be used.

Next, using the chemical vapor deposition (CVD) method, above the first variable resistance layer 103a, tantalum oxide film ($TaO_yC_z$ film) including the non-metal element A (carbon) is deposited, and the second variable resistance layer 103b is formed (corresponding to the third step). It should be noted that the oxygen content atomic percentage of the second variable resistance layer 103b and the content percentage of carbon that is the non-metal element A can be controlled according to types of reactive gas, supply time, and substrate temperature. For example, when oxygen is used as reactive gas, a degree of progress in autolysis reaction can be controlled by the oxygen gas flow rate and the substrate temperature.

More specifically, first, in the film formation chamber, a substrate is held which is heated at a temperature from 300[° C.] to 420[° C.].

Next, in a state where a source material is filled and heated in a material container, by performing bubbling with carrier gas such as nitrogen, source gas is introduced into the film formation chamber (the first sub-step). As the material of tantalum (Ta source), tert-Butylimidotris(diethylamido)tantalum represented by the chemical formula below (($CH_3$)$_3$CNTa[N($C_2H_5$)]$_3$ Hereinafter, TBTDET is used as abbreviation) is used.

[Chemical formula 1]

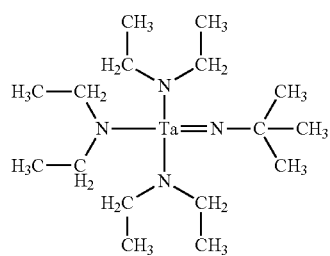

(1)

By heating the Ta source at a temperature from 85° C. to 110° C. and performing bubbling on the Ta source with nitrogen gas, Ta source gas is introduced into the film formation chamber. With this, the autolyzed material is absorbed to the substrate surface, and a few atomic layers are formed. It should be noted that the supply time of Ta source is set to 2 [s] to 10 [s].

Next, unnecessary source gas is removed through purging the film formation chamber with nitrogen gas for 15 seconds to 30 seconds (the second sub-step). Next, Ta is oxidized through the oxidation reaction by introducing $O_2$ as reactive gas, and the ligand of the source is oxidized and removed as a by-product (the third sub-step). The supply time of reactive gas $O_2$ is set to a range from 3 [s] to 20 [s]. By using oxygen gas ($O_2$), film including carbon can be manufactured.

Next, unnecessary reactive gas and a by-product are removed through purging the reactive chamber with nitrogen gas for 3 seconds to 10 seconds (the fourth sub-step).

The first to fourth sub-steps are determined as a basic cycle. By repeating the basic cycle the number of times according to the film thickness, the second variable resistance layer 103b is formed.

Lastly, according to the DC sputtering method, the upper electrode material is deposited above the second variable resistance layer 103b, and then the upper electrode layer 104 is formed (corresponding to the fourth step). Here, Ir is deposited as the upper electrode material. The Ir film is formed using Ir target, for example, in a room temperature condition, by setting the chamber pressure to 0.03 [Pa] to 3 [Pa] and setting the Ar flow rate to 20 [sccm] to 100 [sccm].

(Modification of Method for Manufacturing Nonvolatile Memory Device 100 According to Embodiment 1)

It should be noted that as the first metal oxide comprised in the first variable resistance layer 103a and the second metal oxide comprised in the second variable resistance layer 103b, tantalum oxide is described as an example. However, the first metal oxide and the second metal oxide are not limited to such. As the first metal oxide and the second metal oxide, for example, (i) a transition metal oxide such as hafnium oxide, zirconium oxide, nickel oxide, titanium oxide, vanadium oxide, cobalt oxide, zinc oxide, niobium oxide, tungsten oxide (w), or (ii) aluminum (Al) oxide may be used.

When, in the case of using hafnium oxide, the composition of the first metal oxide is $HfO_x$ and the composition of the second metal oxide is $HfO_y$, $0.9 \leq x \leq 1.6$ and $1.8 < y < 2.0$ may be satisfied. The first variable resistance layer 103a using hafnium oxide, for example, can be generated according to the reactive sputtering method using Hf target and sputtering in argon gas and oxygen gas. Moreover, the second variable resistance layer 103b using hafnium oxide, for example, can be generated according to the CVD method using, as a material source, tetra(ethylmethylamino)hafnium (Hf(NCH$_3$C$_2$H$_5$)$_4$).

When, in the case of using zirconium oxide, the composition of the first metal oxide is $ZrO_x$ and the composition of the second metal oxide is $ZrO_y$, $0.9 \leq x \leq 1.4$ and $1.9 < y < 2.0$ may be satisfied. The first variable resistance layer 103a using zirconium oxide, for example, can be generated according to the reactive sputtering method which uses Zr target and in which sputtering is performed in argon gas and oxygen gas. Moreover, the second variable resistance layer 103b using zirconium oxide, for example, as a material source, can be generated according to the CVD method using zirconium chloride ($ZrCl_4$).

Moreover, regarding nickel oxide and titanium oxide, although not described in detail, the first variable resistance layer 103a can be formed according to the sputtering method, and the second variable resistance layer 103b is formed according to the CVD method. It should be noted that in the CVD method, in the case of nickel oxide, as a material source, nickel 1-dimethylamino-2 methyl-2 butanorate (Ni ($C_7H_{16}NO$)) is used. In the case of titanium oxide, as a material source, tetraethoxytitanium (Ti(OC$_3$H$_7$)$_4$) is used.

Vanadium oxide, cobalt oxide, zinc oxide, and niobium oxide, although not described in detail, as similarly to tantalum oxide, are suitable as the first metal oxide and the second metal oxide.

Moreover, in the present embodiment, as an example of a method for forming the second variable resistance layer 103b, the CVD method using an organic metallic compound as a material has been described. However, the second variable resistance layer 103b may be formed according to the ALD method in which every atomic layer is grown, a sputter process using target including carbon, and a sputtering method in which targets are simultaneously discharged.

(Composition and Film Density of Second Variable Resistance Layer, and Characteristics of Variable Resistance Element)

Next, a relationship between (i) the composition and film density of the second variable resistance layer 103b and (ii) characteristics of the variable resistance element (initial resistance value and initial breakdown voltage) will be described.

(Relationship Between Content Percentage of Non-Metal Element A and Film Density)

Here, Table 1 shows results in which thin films comprised in metal oxide are formed by changing conditions according to the ALD method, the CVD method, and the sputtering method (noted as sputtering in the table). Then, the formed films are evaluated. It is noted that the sputtering method, especially, is a method for forming a thin film which does not include carbon, using a target which does not include carbon. It is shown as a comparison example. Therefore, in the case where the target including carbon is used and in the case of the sputtering method for causing a plurality of targets to discharge, it is possible that the results will be different from those shown in Table 1.

Moreover, in the ALD method, as a condition, a thin film is formed according to oxidized gas type ($O_2$ and $O_3$) at a substrate heating temperature [° C.](310[° C.]). In the CVD method, as a condition, a thin film is formed according to a substrate heating temperature [° C.](310[° C.], 355[° C.]) and according to oxidized gas type ($O_2$ and $O_3$). A composition analysis is made according to Rutherford Backscattering Spectrometry (RBS).

TABLE 1

| Sample No. | Substrate heating temperature [° C.] | Oxidized gas type | O [atm %] | Ta [atm %] | C [atm %] | Film formation method |
|---|---|---|---|---|---|---|
| 1 | 310 | $O_2$ | 424 | 24.9 | 2.7 | ALD |
| 2 | 355 | | 59.2 | 19.7 | 21.1 | CVD |
| 3 | 400 | | 46.9 | 10.8 | 42.3 | |
| 4 | 310 | $O_3$ | 75.0 | 25.0 | — | ALD |
| 5 | 355 | | 75.7 | 24.3 | — | CVD |
| 6 | 25 | — | 414 | 28.6 | — | Sputtering |

From Table 1, it is found that the content of oxygen included in the second variable resistance layer 103b depends on a film formation method and an oxidized gas type at the time of film formation. When $O_2$ is used as the oxidized gas, by controlling a progress in autolysis reaction of the source, the carbon content atomic percentage in the second variable resistance layer 103b (an example of the non-metal element A) can be controlled. Therefore, among the thin films (Sample Nos. 1 to 5) formed according to the ALD method and the CVD method, it is possible to estimate that in the thin films (Sample Nos. 1 to 3) formed by using $O_2$ as the oxidized gas, carbon is detected. Conversely, among the thin films formed according to the ALD method and the CVD method, in the thin films (Sample Nos. 4 to 5) formed by using $O_3$ as the oxidized gas, a progress in autolysis of the source is difficult to be controlled and the source gas is completely decomposed. Therefore, it is estimated that carbon in the film is not detected. It should be noted that the composition of carbon analyzed according to the RBS method generates a relatively large margin of error of ±4[%] per [atm %] Therefore, errors are generated in x, y, and z values. When the error caused by the RBS method is considered, it is desirable that the value of (y+z) is in a range of $0.71 \leq y+z \leq 0.93$. Moreover, it is desirable that the error regarding carbon is in a range from no less than 2 [atm %] to no more than 45 [atm %].

Table 2 shows results in which the film density is evaluated for each of the sample Nos. 1 to 6 shown in Table 1. Here, the thin film is evaluated by measuring X-ray reflectivity (XRR). As a measurement device, ATX-G made by Rigaku Corporation is used, and as an X ray source, CuK alpha:wavelength=1.5418 Å (8.04 KeV) is used. The measurement of X ray reflectivity, specifically, is performed by comparing (i) reflexivity data obtained by causing an X-ray to enter at an angle of 0.30 to 60 against the thin film surface for evaluating the X ray, and detecting the intensity of the reflected X ray with (ii) a simulation model. As a simulation model, "GlobalFit" software made by Rigaku Corporation is used.

TABLE 2

| Sample No. | Substrate heating temperature [° C.] | Oxidized gas type | Film density [g/cm$^3$] | Film formation method |
|---|---|---|---|---|
| 1 | 310 | $O_2$ | 5.60 | AVD |
| 2 | 355 | | 6.91 | CVD |
| 3 | 400 | | 4.24 | |
| 4 | 310 | $O_3$ | 7.51 | ALD |
| 5 | 355 | | 7.66 | CVD |
| 6 | 25 | — | 7.94 | Sputtering |

From Table 2, among the thin films (Sample Nos. 1 to 5) formed according to the ALD method and the CVD method, the film densities of the thin films formed by using $O_3$ as the oxidized gas (Sample Nos. 4 to 5) are 7.51 to 7.77 [g/cm$^3$]. This means that the film density of the thin film manufactured according to the sputtering method (Sample No. 6) is 7.94 [g/cm$^3$], and almost the same film density as the thin film using Sample Nos. 4 and 5. Meanwhile, the film densities of the thin films (Sample Nos. 1 to 3) using $O_2$ as an oxidized gas and formed according to the ALD method or the CVD method are 4.24 to 6.91 [g/cm$^3$]. It is obvious that the film densities are smaller than those of other thin films (Sample Nos. 4 to 6). Regarding Sample No. 3 having a large amount of carbon in the thin film in Table 1, the film density of Sample No. 3 in Table 2 is decreased to (4.24/7.94)×100=53[%] compared with the thin film (Sample No. 6) manufactured according to the sputtering method in Table 2.

Furthermore, the thin film comprising oxygen-deficient tantalum oxide is formed through plasma oxidation in a condition of wafer temperature of 250 to 350° C. and DC power 150 to 250 [W]. The film density of the thin film formed through plasma oxidation is 7.98 [g/cm$^3$]. As a result, by incorporating the non-metal element A into the film, it is found that the film density can be effectively decreased.

As described above, the results of Table 1 and Table 2 show that when the carbon content atomic percentage in a metal oxide comprised in the thin film is higher, the film density is lower. Since some of the atoms comprised in the thin film are replaced with carbon atoms each having a smaller atomic weight (in other words, the atomic radius is larger than that of oxygen), mass in a unit cell, in other words, film density in a unit cell is decreased.

For example, consider the case of tantalum. Metal Ta has a tetragonal crystalline structure, and its density is 16.6 [g/cm$^3$]. Consider tantalum oxide in which some of Ta atoms in the metal Ta crystal are replaced with oxygen atoms. The density of $TaO_2$ having a rutile-type crystalline structure is 9.95 [g/cm$^3$]. Compared with the density of the metal Ta crystal without including oxygen atom, the density is significantly decreased. The density of further oxidized $Ta_2O_5$ is further decreased to 8.735 [g/cm$^3$]. The same is also true to elements other than Ta. Moreover, for example, although the density of metal hafnium is 13.29 [g/cm$^3$], the density of hafnium oxide is significantly decreased to 9.68 [g/cm$^3$]. In other words, in the case where some of the metal atoms comprised in a metal crystal are replaced with oxygen atoms having an atomic weight smaller than that of the metal atom (having an atomic radius larger than that of oxygen), the density is decreased when the number of oxygen atoms comprised in a crystal is increased.

For the same reason, by replacing the metal atom or the oxygen atom with the non-metal element A other than oxygen, specifically, by replacing the metal atom or the oxygen atom with one of boron (atomic weight of about 11), carbon (atomic weight of about 12), nitrogen (atomic weight of about 14), and the like that have an atomic weight smaller than that of oxygen (atomic weight of about 16), the density can be further decreased. In other words, by replacing the metal atom or the oxygen atom with the non-metal element A other than oxygen, specifically, by replacing the metal atom or the oxygen atom with one of boron (atomic radius of about 0.82 A (angstrom)), carbon (atomic radius of about 0.77 A), nitrogen (atomic radius of about 0.75), and the like that have an atomic radius smaller than that of oxygen (atomic weight of about 0.73), the density can be further decreased. For example, when a thin film is formed according to the CVD method or the ALD method, boron and nitrogen can be contained in a thin film by providing borane gas and $NH_3$ gas as a source gas. Furthermore, an element included in the source gas can be a supply source for carbon and nitrogen.

(Relationship Between Film Density and Initial Breakdown Voltage)

Next, a variable resistance element each using Sample Nos. 1 to 7 shown in Table 1 and Table 2 as the second variable resistance layer is actually manufactured, and a relationship between the film density and the initial breakdown voltage is evaluated.

Figure 2:
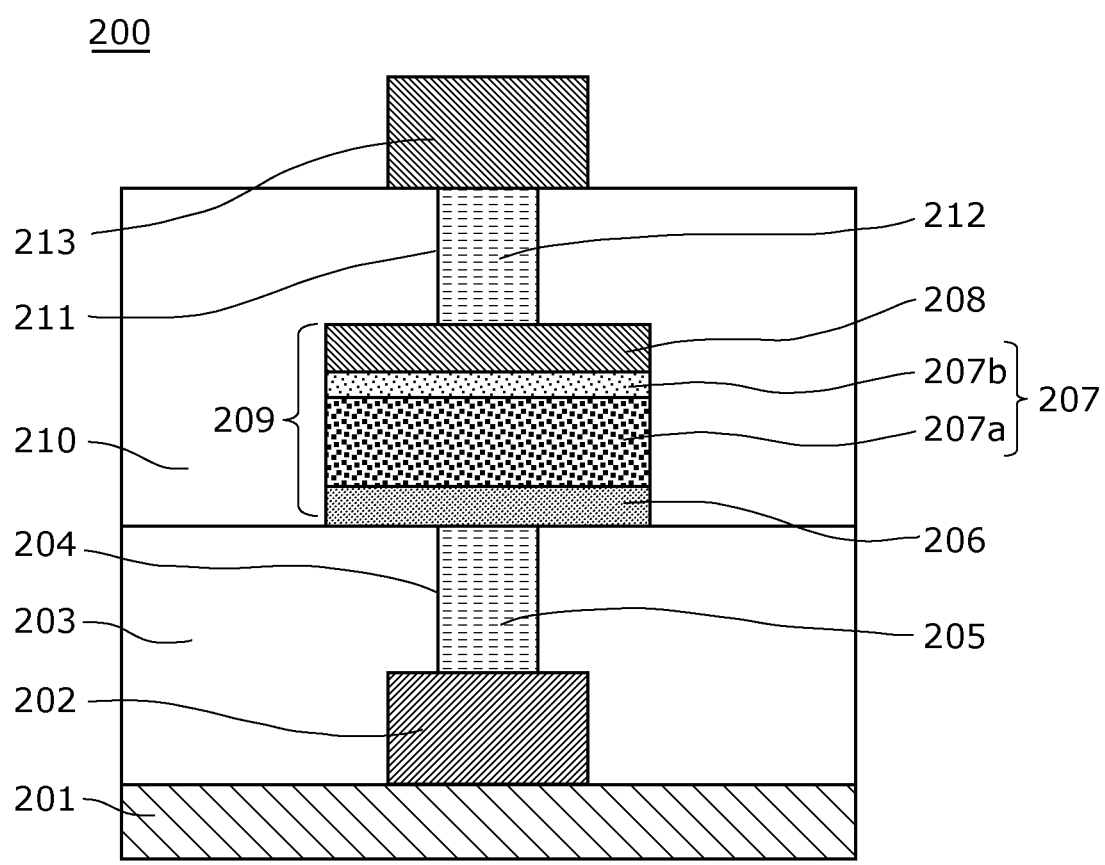
FIG. 2 is a cross-sectional view of an example of a partial configuration of an evaluation device which includes a variable resistance element for evaluation.

Here, FIG. 2 shows a partial configuration example of an evaluation device 200 including a variable resistance element 209 that is actually manufactured in the evaluation.

The evaluation device 200, as shown in FIG. 2, has a planer structure and includes a Si wafer 201, a line 202 formed above the Si wafer 201, a SiN film 203 having a thickness of 100 [nm] and formed to cover the Si wafer 201 and the line 202, and a plug 205 formed in a contact hole 204 which reaches the line 202 by passing through the SiN film 203. Furthermore, the evaluation device 200 includes the variable resistance element 209 which includes a lower electrode layer 206 that is formed to cover the plug 205 above the SiN film 203, a first variable resistance layer 207a formed above the lower electrode layer 206, a second variable resistance layer 207b formed above the first variable resistance layer 207a, and an upper electrode layer 208 formed above the second variable resistance layer 207b. The variable resistance layer 207 comprises the first variable resistance layer 207a and the second variable resistance layer 207b. Furthermore, the evaluation device 200 includes a SiN film 210 formed to cover the variable resistance element 209, a plug 212 formed in a contact hole 211 which reaches the upper electrode layer 208 of the variable resistance 209 by passing through the SiN 210, and a line 213 formed above the SiN film 210 to cover the plug 212.

It should be noted that the lower electrode layer 206 is formed using TaN film. Moreover, the first variable resistance layer 207a is formed, according to the sputtering method, by depositing $TaO_x$ at a thickness of 30 [nm]. The second variable resistance layer 207b is formed according to the CVD method by setting a substrate temperature of 355[° C.] and depositing $TaO_yA_z$ at a thickness of 8 [nm]. The upper electrode layer 208 is formed, according to the sputtering method, by depositing Ir at a thickness of 50 [nm].

Before the relationship between the film density and the initial breakdown voltage is considered, a relationship between (i) a voltage pulse applied to the variable resistance element 209 in a normal resistance change operation (write operation) and (ii) a resistance value corresponding to each of the resistance states.

Figure 3:
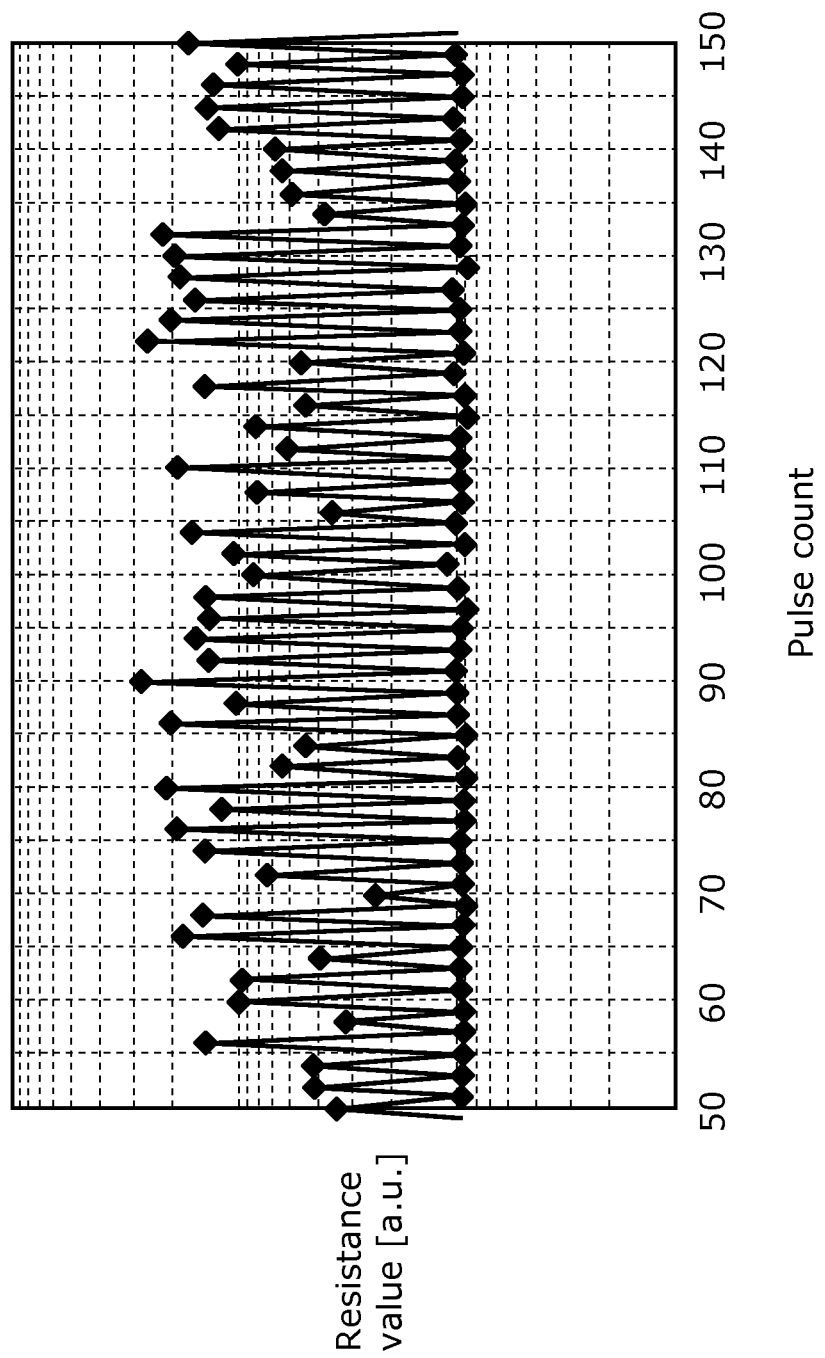
FIG. 3 is a graph showing a relationship between the number of pulse application times and a resistance value in the normal operation of a variable resistance nonvolatile memory device according to Embodiment 1.

Here, FIG. 3 shows a relationship between (i) the number of voltage pulse applications (pulse count) when a normal write operation is performed and (ii) a resistance value (common to Samples 1 to 7 shown in Table 1 and Table 2). In the normal write operation, by applying two types of voltage pulse having different polarities from each other to between the electrodes of the upper electrode layer and the lower electrode layer of the variable resistance element 209, the resistance state is caused to reversibly change between the high resistance state and the low resistance state. More specifically, when the resistance state changes from the low resistance state to the high resistance state, a negative voltage pulse (voltage: −1.5 [V], pulse width: 100 [ns]) is applied to between the electrodes of the upper electrode layer and the lower electrode layer of the variable resistance element 209. Conversely, when the resistance state changes from the high resistance state to the low resistance state, a positive voltage pulse (voltage: 2.4 [V], pulse width: 100 [ns]) is applied to between the electrodes of the variable resistance element 209. As shown in FIG. 3, when the number of voltage pulse applications is in a range from 50 times to 150 times, the high resistance state is higher than the low resistance state by about one digit in the resistance value of the variable resistance element 209. It should be noted that the resistance value in a vertical axis in FIG. 3 is denoted by an arbitrary unit [a.u.]. It should be noted that in the normal write operation, a voltage component of the voltage pulse applied to the variable resistance element 209 is distributed to the first variable resistance layer 207a that is a high density layer having a relatively high film density and to the second variable resistance layer 207b that is a low density layer having a relatively low film density. Of the voltage component distributed to the first variable resistance layer 207a and the voltage component distributed to the second variable resistance layer 207b, the voltage component distributed to the second variable resistance layer 207b contributes to a resistance change operation. Therefore, by setting the resistivity of the second variable resistance layer 207b to be higher than the resistivity of the first variable resistance layer 207a, it is believed that the voltage component distributed to the second variable resistance layer 207b is greater and the nonvolatile memory device can be operated at a low voltage. In the case of FIG. 3, a resistance change operation is possible at a voltage having an absolute value of no more than 2.4 [V].

The relationship between the initial resistance value and the initial breakdown voltage is continuously considered.

Figure 4:
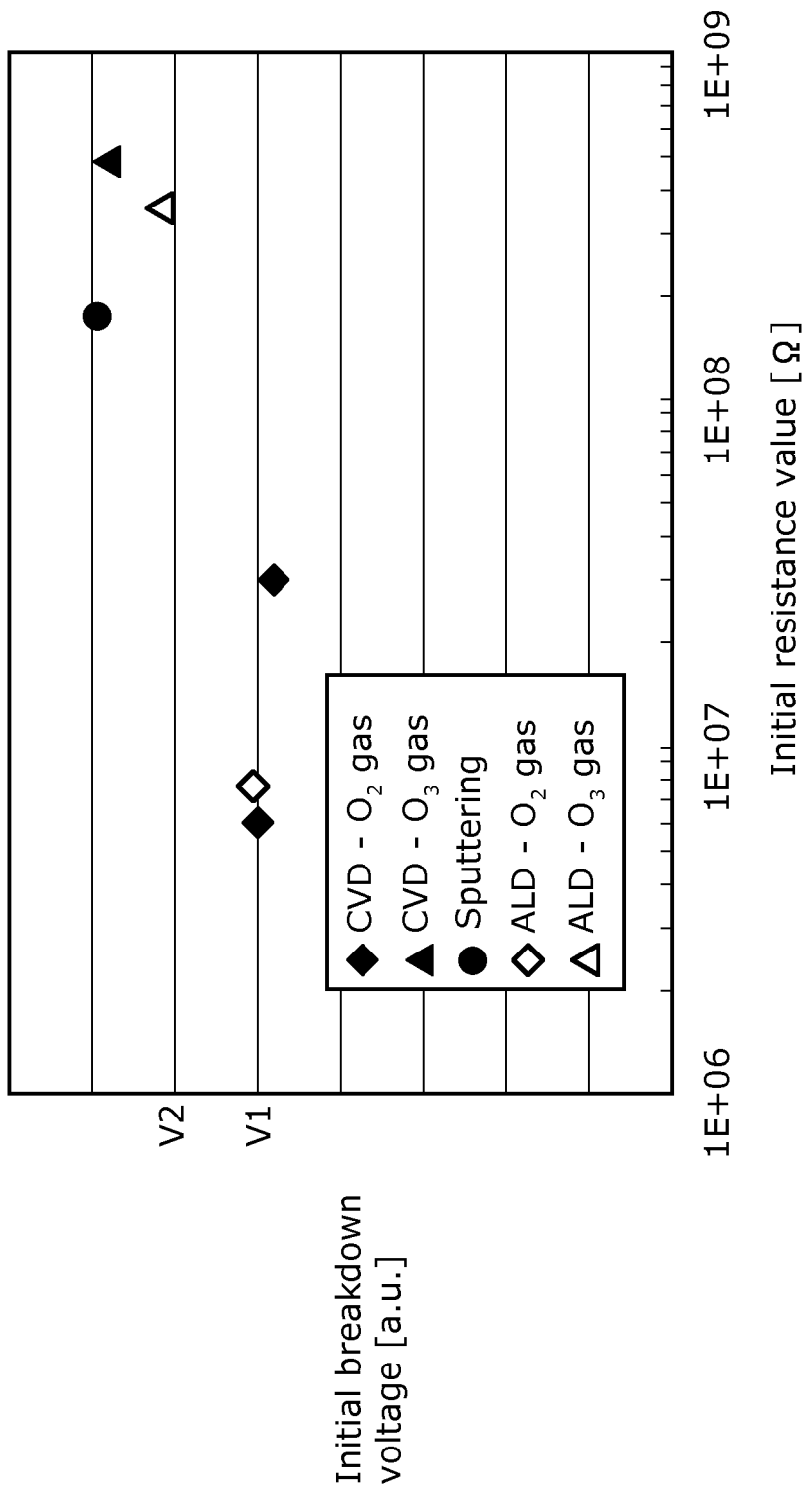
FIG. 4 is diagram showing a relationship between an initial resistance value and a voltage value of the initial breakdown voltage in the nonvolatile memory device including a variable resistance element for evaluation.

FIG. 4 is a graph showing a relationship between the initial resistance value [Ω] each for Samples 1, 2, 3, 4, 5, and 6 shown in Table 1 and Table 2 and the initial breakdown voltage value [V].

As shown in FIG. 4, among the samples which formed the second variable resistance layer according to the ALD method or the CVD method, the initial resistance values of Samples 1, 2, and 3 using $O_2$ as oxidized gas are no more than $3 \times 10^7$[Ω]. Meanwhile, among the samples which formed the second variable resistance layer according to the ALD method or the CVD method, the initial resistance values of samples using $O_3$ as oxidized gas and Samples 4, 5, and 6 which formed the second variable resistance layer according to the sputtering method are no less than $10^8$[Ω]. In other words, the initial resistance values of Samples 1, 2, and 3 using $O_2$ as oxidized gas are lower than the other samples by no less than one digit.

Moreover, as shown in FIG. 4, the initial breakdown voltage for Samples 1, 2, and 3 is about V1 [V], and the initial breakdown voltage for the other Samples 4, 5, and 6 is no less than V2 [V] that is greater than V1. In other words, the initial breakdown voltage for Samples 1, 2, and 3 using $O_2$ as oxidized gas is decreased compared with the other Samples by about ΔV (=V2−V1) [V]. It should be noted that when the initial resistance value of the variable resistance element is decreased, it is believed that the voltage value distributed to the second variable resistance layer 207b is also decreased. When only the distribution of the voltage value is considered, it is predicted that the initial breakdown voltage applied to the nonvolatile memory device for causing a resistance change phenomenon is greater. In reality, however, the initial breakdown voltage each for Samples 1, 2, and 3 is about V1 [V], and is decreased compared with the other Samples 4, 5, and 6 by about ΔV (=V2−V1) [V]. Therefore, the decrease in the initial breakdown voltage is significantly caused by a film quality of the second variable resistance layer 207b.

Therefore, a relationship between (i) the film density of the second variable resistance layer 207b that is a low density layer and (ii) the initial breakdown voltage is considered. It should be noted that a value of the initial breakdown voltage is greater than a voltage value to be applied to between the electrodes of the variable resistance element in a normal resistance change operation shown in FIG. 3.

Figure 5:
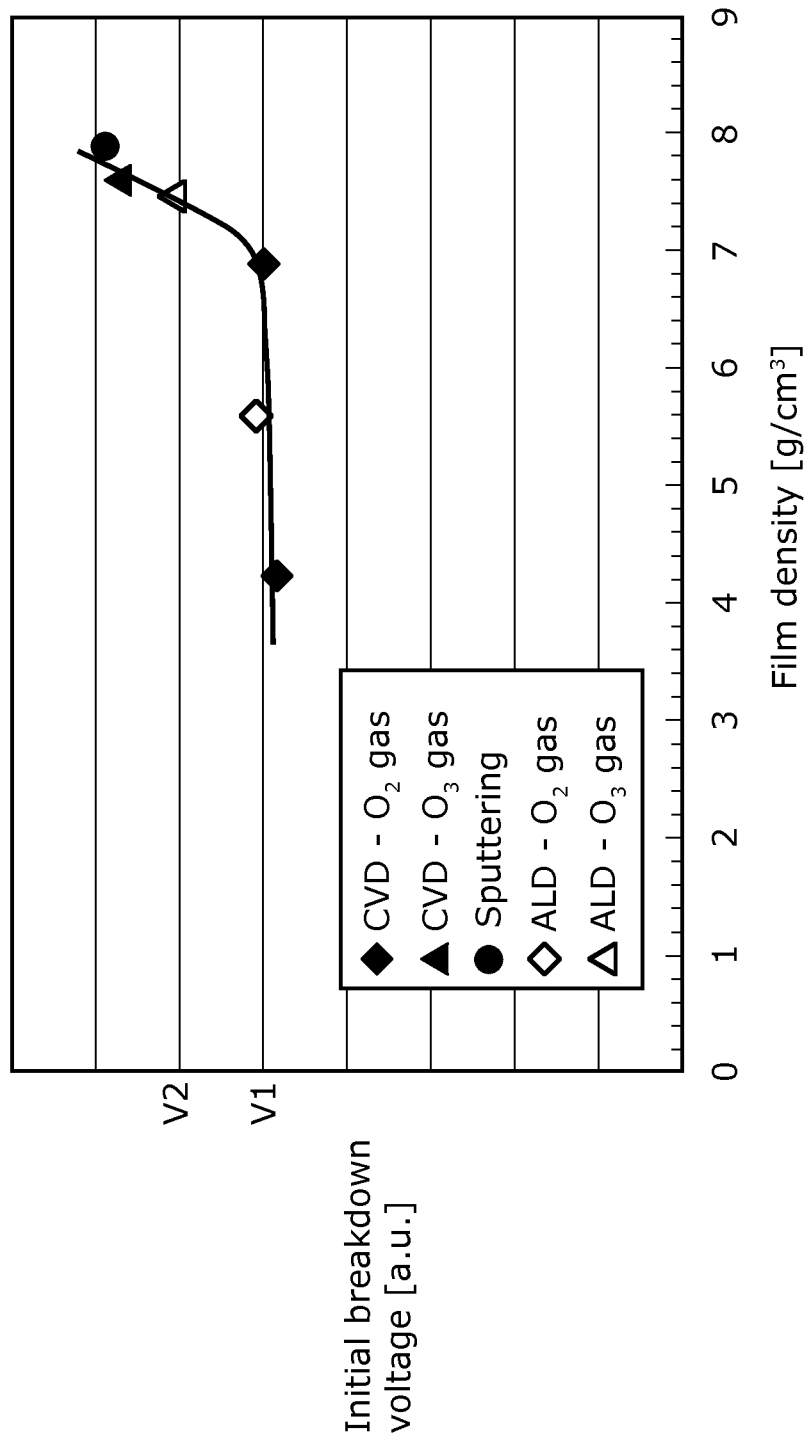
FIG. 5 is diagram showing a relationship between a film density and a voltage value of the initial breakdown voltage in the nonvolatile memory device including a variable resistance element for evaluation.

Here, FIG. 5 is a graph showing a relationship between the film density [g/cm$^3$] for each of Samples 1, 2, 3, 4, 5, and 6 shown in Table 1 and Table 2 and the initial breakdown voltage.

From FIG. 5, it is found that when the film density is decreased, the initial breakdown voltage is decreased. The initial breakdown voltage is about V1 [V] especially in Samples 1, 2, and 3 having a film density of less than 7 [g/cm$^3$], and it is found that the initial breakdown voltage is decreased compared with the other Samples by about ΔV (=V2−V1) [V]. This is because it is estimated that by decreasing the film density of the second variable resistance layer, dielectric breakdown of the second variable resistance layer is likely to occur and a conductive path called filament is easily formed at a low voltage. It should be noted that Patent Literature 1 discloses that the second variable resistance layer (TaO$_y$ film, not including the non-metal element A) is formed according to a plasma oxidation method. When the film density in this case is evaluated by XRR, it is 7.98 [g/cm$^3$].

As described above, from the graphs shown in FIGS. 4 and 5, by adding the non-metal element A having an atomic weight smaller than that of oxygen atom to the second metal oxide comprised in the second variable resistance layer (here, tantalum oxide), it is found that the film density can be more effectively decreased.

It should be noted that from Table 2, it is favorable that the film density of the second variable resistance layer is in a range from no less than 4 [g/cm$^3$] to no more than 7 [g/cm$^3$]. It should be noted that in the graph in FIG. 5, when the film density by the XRR evaluation is greater than 7 [g/cm$^3$], a decrease in the initial breakdown voltage is little seen. Meanwhile, when the film density is less than 4 [g/cm$^3$], the oxygen content atomic percentage is small in the second variable resistance layer, with the result that it is possible that the oxidation-reduction reaction in the conductive path portion is difficult to occur.

Incidentally, by decreasing the density by adding the non-metal element A other than oxygen to the second variable resistance layer, in the heating process at the manufacturing of a device, it is expected that interdiffusion of oxygen between the first variable resistance layer and the second variable resistance layer is decreased. Therefore, a change in film density of the second variable resistance layer before and after heat treatment is evaluated by processing stacked structure samples of the first variable resistance layer and the second variable resistance layer for 10 minutes at a temperature of 450° C. in nitrogen atmosphere in a heating oven. As a result, in Samples Nos. 1, 2, and 3 shown in Table 1 and Table 2, the difference in film thickness of the second variable resistance layer before and after the heat treatment is 0.01 [nm]. Meanwhile, in Sample 7 shown in Table 1 and Table 2, the difference in film thickness of the second variable resistance layer before and after the heat treatment is 0.3 [nm] (a decrease by 0.3 [nm] is found). It should be noted that when the film thickness of the second variable resistance layer is changed according to the heating process, a fluctuation between elements is increased and reliability can be degraded. Since the evaluation device 200 can reduce a change in film thickness of the second variable resistance layer in the heating process by including the non-metal element A in the second variable resistance layer, the evaluation device 200 is believed to effectively prevent an increase in fluctuation between elements and degradation in reliability.

It should be noted that in the present embodiment, as the non-metal element A, carbon is described as an example. However, the non-metal element A is not limited to carbon. From a viewpoint that the density is decreased by replacing oxygen atom with the non-metal element A, the non-metal element A may be an element having an atomic weight smaller than that of oxygen atom. In other words, for example, nitrogen and boron are acceptable.

When nitrogen is used as the non-metal element A, it is possible to include nitrogen in the second variable resistance layer by adding NH$_3$ gas when the second variable resistance layer is formed according to the ALD method or the CVD method. More specifically, in the third step of forming the above described second variable resistance element (the first sub-step to the fourth sub-step), in the first sub-step, the substrate above which the first variable resistance layer is formed is heated at a temperature of 325[° C.] and is held in a film formation chamber. When Ta source (TBEDET) is introduced into the film formation chamber, NH$_3$ is simultaneously added at a flow rate of 300 [sccm]. Furthermore, in the third sub-step, O$_2$ is introduced as reactive gas. It should be noted that actually, the second variable resistance layer is formed using nitrogen as the non-metal element A, and then the second variable resistance layer is analyzed by RBS. It is found that tantalum is 36.6 [atm %], oxygen is 11.5 [atm %], and nitrogen is 51.9 [atm %]. This means that nitrogen is included in the second variable resistance layer. The formed film has insulation properties. By using TaO$_y$N$_z$ film as the second variable resistance layer, the same effect as that of the present embodiment including carbon can be expected.

When boron is used as the non-metal element A, it is possible to include boron in the second variable resistance layer by adding B$_2$H$_6$ gas when the second variable resistance layer is formed according to the ALD method or the CVD method.

Embodiment 2

A nonvolatile memory device according to Embodiment 2 and a method for manufacturing the nonvolatile memory device according to Embodiment 2 will be described with reference to FIG. 6A.

The difference of a nonvolatile memory device 300A according to the present embodiment from the nonvolatile memory device 100 according to Embodiment 1 is that a non-ohmic element 309 is further stacked above a variable resistance element 308.

(Configuration of Nonvolatile Memory Device 300A According to Embodiment 2)

The configuration of the nonvolatile memory device 300A according to the present embodiment will be described with reference to FIG. 6A.

Figure 6A:
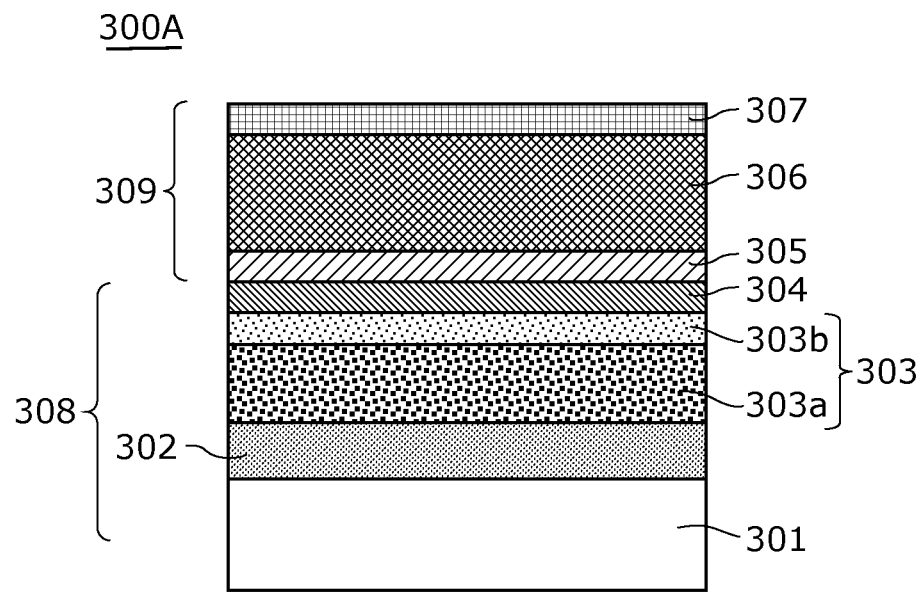
FIG. 6A is a cross-sectional view showing an example of a configuration of a variable resistance nonvolatile memory device according to Embodiment 2.

Here, FIG. 6A is a cross-sectional view showing an example of the configuration of the variable resistance nonvolatile memory device 300A according to the present embodiment.

As shown in FIG. 6A, the nonvolatile memory device 300A includes: a substrate 301; a variable resistance layer 308 which comprises a lower electrode layer 302, an upper electrode layer 304, and a variable resistance layer 303 sandwiched between the two electrodes; and a non-ohmic element 309 which comprises by stacking a first electrode layer 305, a semiconductor layer 306, and a second electrode layer 307 in that order.

It should be noted that the configurations (material, composition, film thickness, and the like) of the lower electrode layer 302 and the upper electrode layer 304 that are comprised in the variable resistance element 308, and the configurations of the first variable resistance layer 303a and the second variable resistance layer 303b that are comprised in the variable resistance layer 303 are the same as those of the variable resistance element 108 according to Embodiment 1.

It is assumed that the non-ohmic element 309, in the present embodiment, is a diode element (current steering element).

Although the first electrode layer 305 in the present embodiment is described by setting tantalum nitride film as an example, the first electrode layer 305 is not limited to such. It should be noted that it is favorable that the first electrode layer 305 comprises a metal nitride comprising the above metal, in the variable resistance layer 303 comprising a metal oxide. In the present embodiment, since the above metal is tantalum in the metal oxide comprised in the variable resistance layer 303, tantalum oxide is suitable.

The semiconductor layer 306, in the present embodiment, is described as an example of the case where nitrogen-deficient silicon nitride film is comprised in. However, the semiconductor layer 306 is not limited to such. The semiconductor layer 306 comprises using tantalum oxide (TaO), alumina (AlO), or titania (TiO), for example.

Moreover, an insulating layer may be used instead of the semiconductor layer 306.

Although the second electrode layer 307, in the present embodiment, is described with an example of the case where it comprises a tantalum nitride film, the second electrode layer 307 is not limited to such. The second electrode layer 307 may comprise tantalum (Ta), aluminum (Al), or a material including one of the elements. The second electrode layer 307 may also comprise a material including titanium (Ti), chrome (Cr), or the like. It should be noted that when titanium (Ti), chrome (Cr), or the like is used, it is favorable that a film comprising Al, Cu, or the like is formed in stack in order to reduce wiring resistance.

(Method for Manufacturing Nonvolatile Memory Device 300A According to Embodiment 2)

Next, a method for manufacturing the nonvolatile memory device 300A according to the present embodiment will be described.

Here, in the present embodiment, the non-ohmic element 309 is formed above the variable resistance layer 308. The method for manufacturing the variable resistance element 308 is the same as the method for manufacturing the variable resistance element 108 according to Embodiment 1.

After the formation of the variable resistance element 308 (implementation of the first sub-step to the fourth sub-step), the first electrode layer 305 is formed by depositing tantalum nitride at a thickness of 20 to 100 [nm] above the upper electrode layer 304 comprised in the variable resistance element 308 (corresponding to the fifth step). More specifically, in the present embodiment, the first electrode layer 305 is formed according to the reactive sputtering method in which a metal tantalum target is sputtered in a mixed gas atmosphere of argon and nitrogen. Film formation time is adjusted such that as a film formation condition, pressure is set to 0.08 to 2 [Pa], substrate temperature is set to 20 to 300[° C.], a flow ratio of nitrogen gas (the ratio of the flow rate of nitrogen gas to the total flow rate of argon and nitrogen) is set to 0 to 40[%], DC power is set to 100 to 1300 [W], and a thickness of tantalum nitride film is to 100 [nm].

Next, the semiconductor layer 306 is formed above the first electrode layer 305 by depositing nitrogen-deficient silicon nitride film at a thickness of 5 to 50 [nm] (corresponding to the sixth step).

More specifically, in the present embodiment, the semiconductor layer 306 is formed according to the reactive sputtering method in which a polycrystalline silicon target is sputtered in a mixed gas atmosphere of argon and nitrogen. Film formation time is adjusted such that as a film formation condition, pressure is set to 0.08 to 2 [Pa], a substrate temperature is set to 20 to 300[° C.], a flow ratio of nitrogen gas (the ratio of the flow rate of nitrogen gas to the total flow rate of argon and nitrogen) is set to 0 to 40[%], DC power is set to 100 to 1300 [W], and a thickness of the silicon nitride film is 5 to 20 [nm].

Next, the second electrode layer 307 is formed by depositing tantalum nitride at a thickness of 20 to 100 [nm] above the semiconductor layer 306 (corresponding to the seventh step). A method for forming the second electrode layer 307 is the same as a method for forming the first electrode layer 305.

Here, a work function of tantalum nitride is 4.6 [eV], and an electron affinity of silicon is 3.8 [eV]. Since the work function of tantalum nitride is significantly higher than the electron affinity of silicon, a Schottky barrier is formed at the interface between the semiconductor layer 306 and the second electrode layer 307. Since in the present embodiment, the second electrode layer 307 and the first electrode layer 305 both comprise tantalum nitride, the non-ohmic element 309 functions as a bidirectional MSM diode.

Modification of Embodiment 2

Figure 6B:
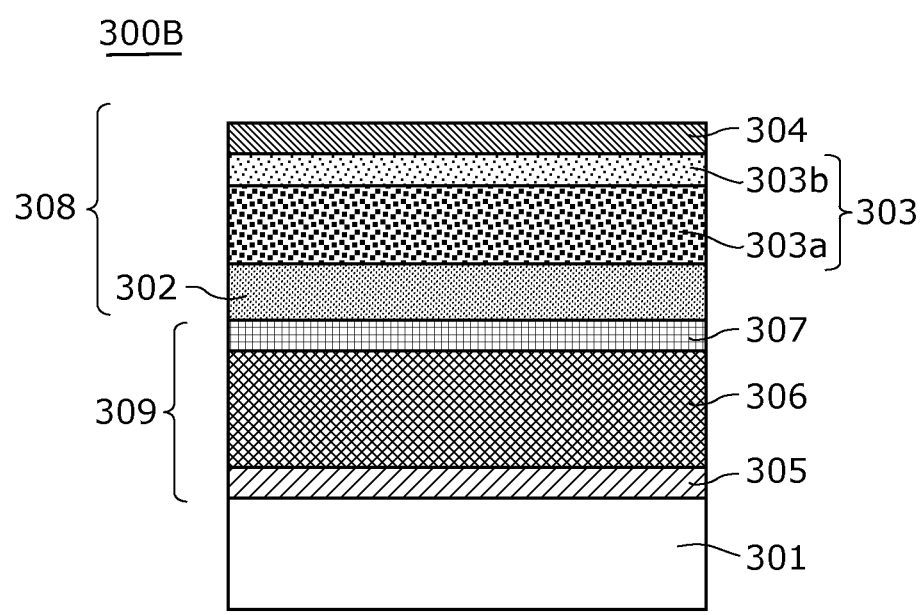
FIG. 6B is a cross-sectional view showing an example of a configuration of a variable resistance nonvolatile memory device according to a modification of Embodiment 2.

Although in the nonvolatile memory device 300A shown in FIG. 6A, the non-ohmic element 309 is formed, above the variable resistance element 308, to be in contact with the upper electrode layer 304 which is in contact with the second variable resistance layer 303b comprising the second metal oxide including the non-metal element A, the non-ohmic element 309 is not limited to such. As shown in FIG. 6B, a nonvolatile memory device 300B may be configured by first forming the non-ohmic element 309, and by then forming the variable resistance element 308 above the non-ohmic element 309.

It should be noted that when TaO is used as the semiconductor layer 306, the semiconductor layer 306 can be formed by oxidation according to a dry thermal oxidation method, a wet thermal oxidation method, or a plasma oxidation method after Ta film is formed, or a method for directly forming $TaO_x$ film according to the reactive sputtering method. Although alumina (AlO) and titania (TiO) are not described in detail, they can be generated using a general technique.

Embodiment 3

A nonvolatile memory device according to Embodiment 3 and a method for manufacturing the nonvolatile memory device according to Embodiment 3 will be described with reference to FIGS. 7A to 15B.

The nonvolatile memory device 100 according to Embodiment 1 comprises the variable resistance element 108, and the nonvolatile memory device 300A and the nonvolatile memory device 300B according to Embodiment 2 each comprise the variable resistance element 308 and the non-ohmic element 309. A nonvolatile memory device 400 according to the present embodiment will be described in the case where it includes a plurality of memory cells each of which comprises a variable resistance element 417 and a non-ohmic element 421.

(Configuration of Nonvolatile Memory Device 400 According to Embodiment 3)

The configuration of the nonvolatile memory device 400 according to the present embodiment will be described with reference to FIGS. 7A to 9.

Figure 7A:
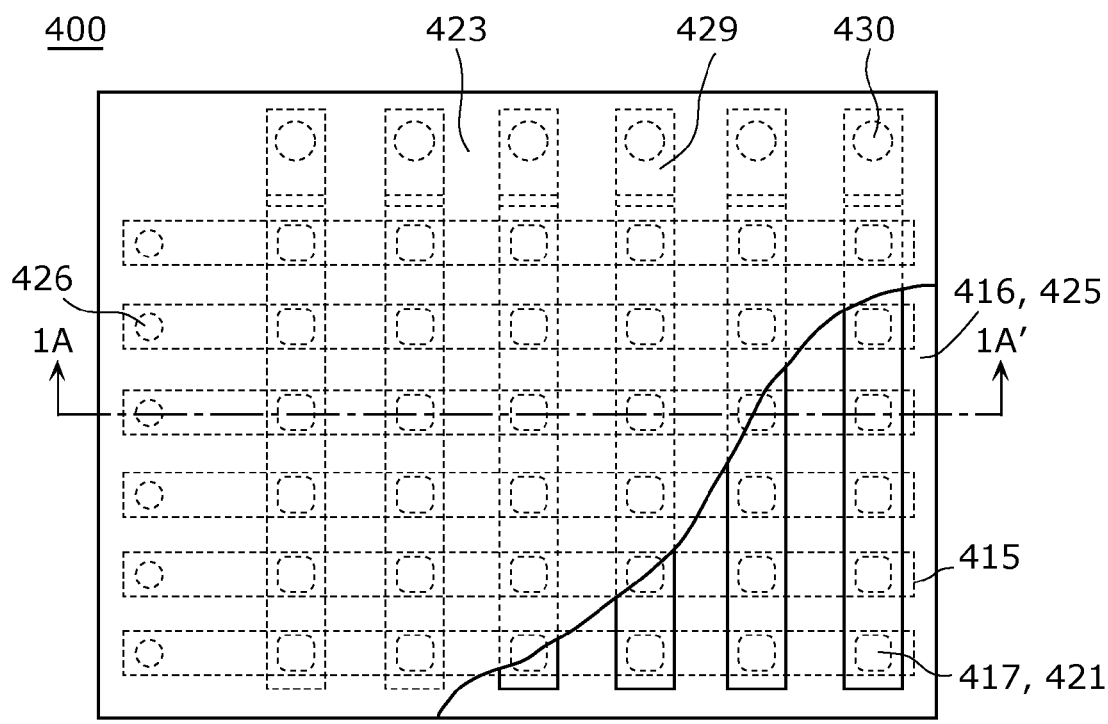
FIG. 7A is a plan view showing an example of a configuration of a nonvolatile memory device according to Embodiment 3.
Figure 7B:
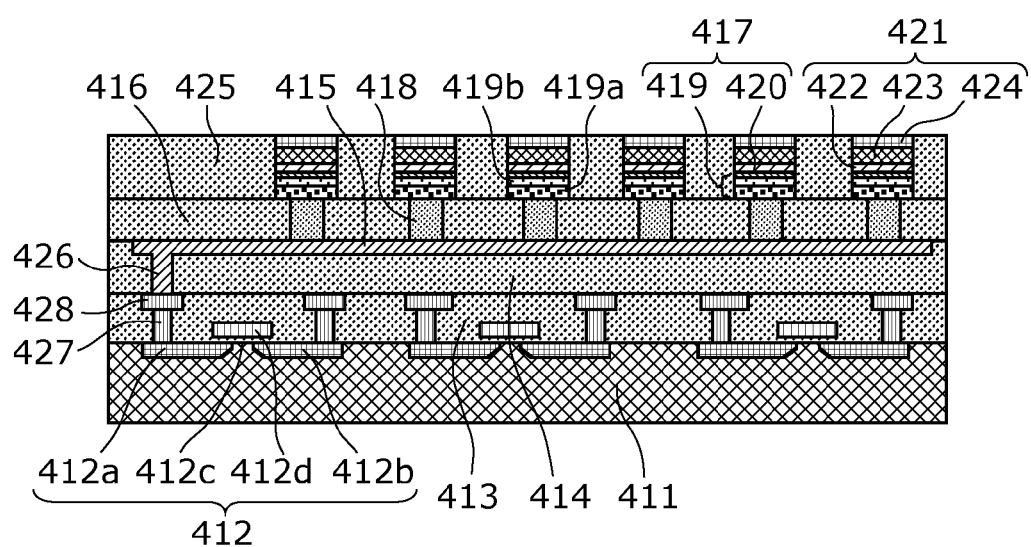
FIG. 7B is a cross-sectional view showing an example of a configuration of a nonvolatile memory device according to Embodiment 3.
Figure 8A:
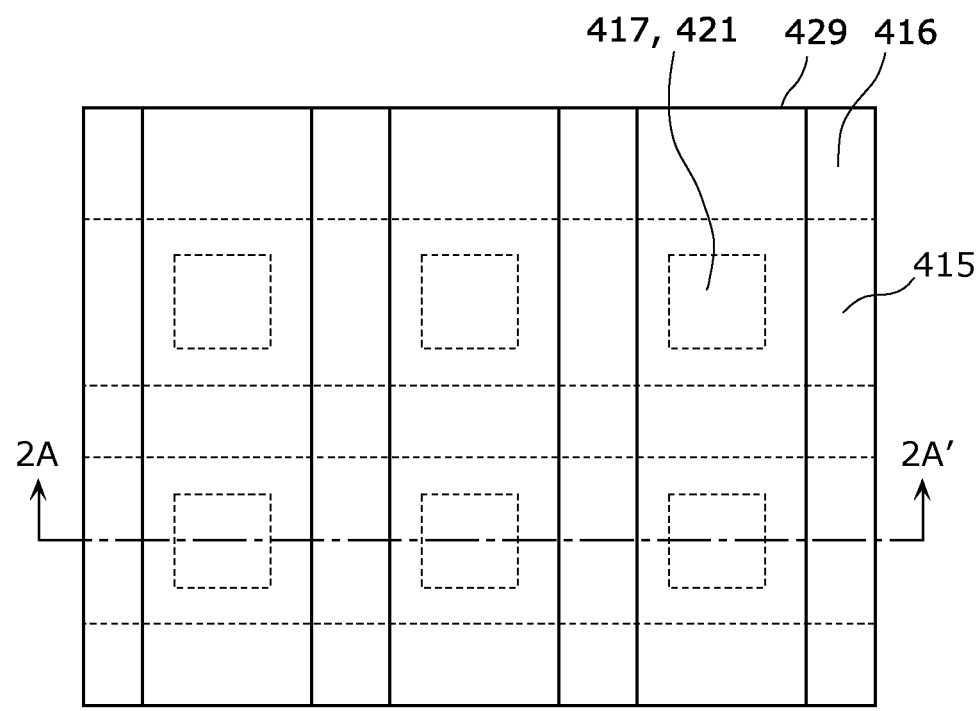
FIG. 8A is a plan view showing the enlarged parts related to a variable resistance element and a non-ohmic element in the nonvolatile memory device according to Embodiment 3.
Figure 8B:
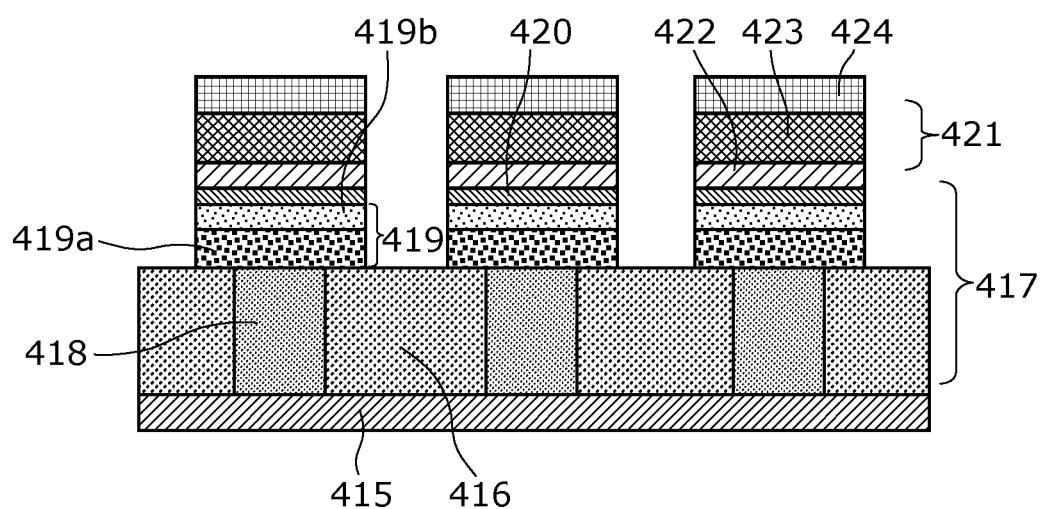
FIG. 8B is a cross-sectional view showing the enlarged parts related to a variable resistance element and a non-ohmic element in the nonvolatile memory device according to Embodiment 3.

Here, FIG. 7A is a plan view (top view) showing an example of the configuration of the nonvolatile memory device 400 according to the present embodiment. Moreover, FIG. 7B is a cross-sectional view showing the configuration of the nonvolatile memory device 400, and is a cross-sectional view when a cross section corresponding to the line 1A-1A' in FIG. 7A is seen in an arrow direction. It should be noted that in the plan view in FIG. 7A, part of the insulation protective layer on the top layer is cut out to make it easier to understand. Moreover, FIG. 8A is a partially enlarged cross-sectional view in which part of the nonvolatile memory device 400 is enlarged to explain the configurations of a memory unit 17 and the non-ohmic element 421. Similarly, FIG. 8B is a cross-sectional view corresponding to FIG. 8A.

The nonvolatile memory device 400 according to the present embodiment, for example, includes a semiconductor circuit layer in which active elements 412 such as a transistor above a substrate 411 comprising a silicon single crystal substrate are integrated. Above the semiconductor circuit layer, a memory array (matrix region) is formed which includes a plurality of memory cells each of which comprises the variable resistance element 417 and the non-ohmic element 421.

More specifically, the semiconductor circuit layer of the nonvolatile memory device 400 includes a substrate 411, an active element 412, an interlayer dielectric 413 formed to cover the substrate 411 and the active element 412, a plurality of embedded conductors 427 formed in the interlayer dielectric 413, and a plurality of semiconductor electrode lines 428 formed in the interlayer dielectric 413.

The active element 412, in the present embodiment, is a transistor, and includes a source region 412a and a drain region 412b formed in the substrate 411, and a gate insulating film 412c and a gate electrode 412d formed above a region between the source region 412a and the drain region 412b. It should be noted that a transistor is exemplified as the active element 412. An element necessary for a memory circuit such as general DRAM is acceptable.

The interlayer dielectric 413, in the present embodiment, comprises a fluorine-containing oxide (for example, SiOF). However, the interlayer dielectric 413 is not limited to such. For example, a carbon-containing nitride (for example, SiCN) which can reduce parasitic capacitance between lines or a material such as an organic resin material (for example, polyimide) may be used.

The embedded conductors 427 are formed corresponding to each of the source region 412a and the drain region 412b of the active element 412.

The semiconductor electrode lines 428 are each formed to be connected to an arbitrary embedded conductor 427 according to a circuit configuration. It is assumed that the semiconductor electrode lines 428, in the present embodiment, are copper (Cu). However, aluminum and the like are acceptable.

The memory array of the nonvolatile memory device 400 includes: an interlayer dielectric 414 formed above the interlayer dielectric 413, an embedded conductor 426 formed in the interlayer dielectric to be in contact with one of the embedded conductors 427; a plurality of lower electrode lines 415 (shaped in stripe) extending in a column direction formed in the interlayer dielectric 414 to be in contact with the embedded conductor 426; an interlayer dielectric 416 in which, above the lower electrode line 415, a contact hole is formed in a position corresponding to a crossing of the upper electrode line 429 and the lower electrode line 415; a variable resistance element 417 which includes the lower electrode layer 418 embedded and formed in the contact hole and formed in contact with the lower electrode line 415, a variable resistance layer 419 formed above the lower electrode layer 418, and an upper electrode layer 420 formed above the variable resistance layer 419; a non-ohmic element 421 formed above the variable resistance element 417; an interlayer dielectric 425 formed to cover the variable resistance element 417 and the non-ohmic element 421; a plurality of upper electrode lines 429 (shaped in stripe) extending in a row direction; and an embedded conductor 430 electrically connected to the upper electrode line 429.

It should be noted that the configuration of the interlayer dielectric 414 is the same as the configuration of the interlayer dielectric 413 in the present embodiment.

Moreover, the configuration of the variable resistance element 417 (material, composition, film thickness, and the like) is the same as the configuration of the variable resistance element 108 according to Embodiment 1. Moreover, the configuration of the non-ohmic element 421 (material, composition, film thickness, and the like) is the same as the non-ohmic element 309 according to Embodiment 2.

The lower electrode line 415, in the present embodiment, is described with an example of the case where it comprises a Ti—Al—N alloy. However, the lower electrode line 415 may be formed with Cu, Al, a Ti—Al alloy, or a stack of these.

The interlayer dielectric 416, in the present embodiment, is described with an example of TEOS-SiO film. However, the interlayer dielectric 416 may comprise silicon oxide (SiO) and silicon nitride (SiN) film, and may comprise silicon carbon nitride (SiCN) (SiOC) film and fluorinated silicon oxide (SiOF) film that are low dielectric constant materials.

The upper electrode line 429, in the present embodiment, comprises the same material as that of the lower electrode line 415. However, another material can be used.

Figure 9:
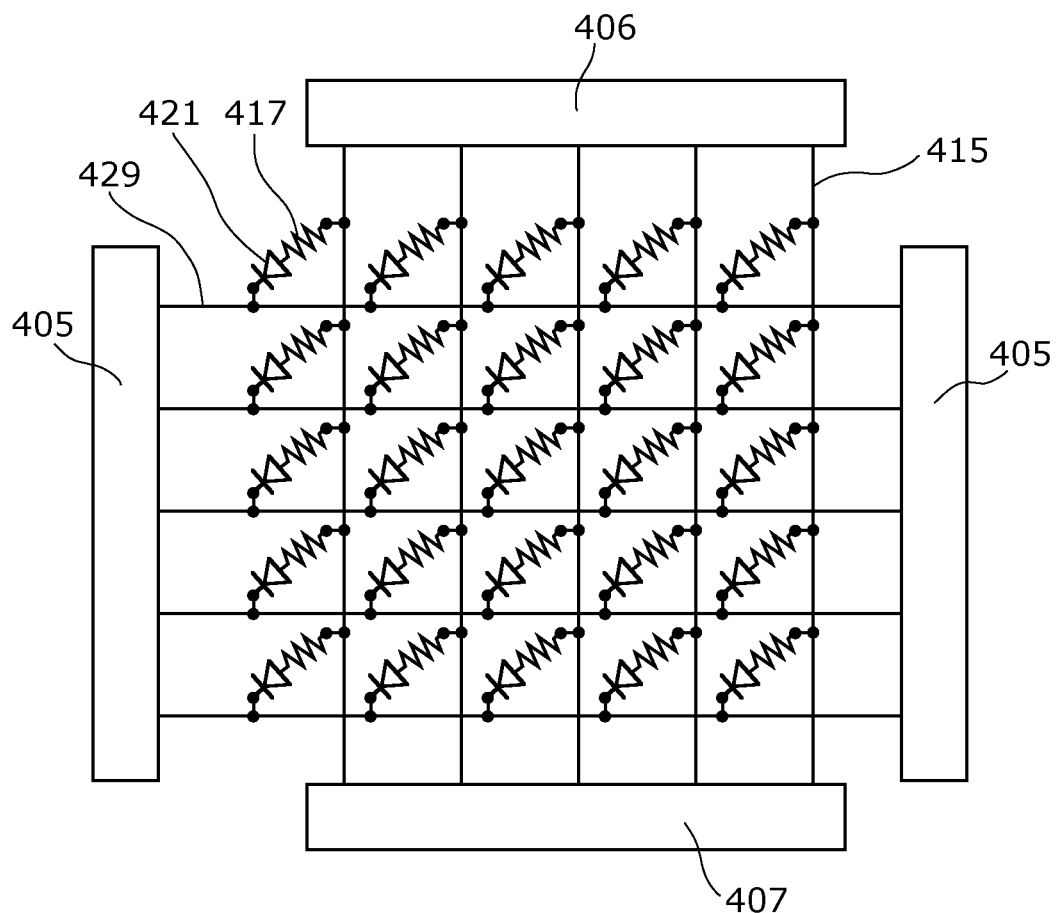
FIG. 9 is a schematic circuit diagram showing an example of a circuit configuration of a nonvolatile memory device according to Embodiment 3.

Here, FIG. 9 is a circuit diagram schematically showing an equivalent circuit diagram of the nonvolatile memory device 400 as shown in FIGS. 7A to 8B and its surrounding circuits.

As shown in FIG. 9, the nonvolatile memory device 400 includes a memory array in which memory cells each in which the variable resistance element 417 and the non-ohmic element 421 are connected in series to each other are disposed in matrix, a bit line decoder 406, a word line decoder 405, and a read circuit 407 that are surrounding circuits.

More specifically, one of the ends of the variable resistance element 417 is connected a corresponding one of the ends of the non-ohmic element 421 (anode terminal), and the other end is connected to the lower electrode line 415. One of the ends of the non-ohmic element 421 (anode terminal) is connected to one of the ends of the variable resistance element 417, and the other end (cathode terminal) is connected to the upper electrode line 429. The lower electrode line 415 is connected to the bid line decoder 406 and the read circuit 407. Moreover, the upper electrode line 429 is connected to the word line decoder 405. In other words, the lower electrode line 415 corresponds to a bit line, and the upper electrode line 419 corresponds to a word line. The surrounding circuit comprises the active element 412 comprising MOSFET, for example.

(Method for Manufacturing Nonvolatile Memory Device 400 According to Embodiment 3)

Next, a method for manufacturing the nonvolatile memory device 400 according to the present embodiment will be described with reference to FIGS. 10 to 15B.

Figure 10:
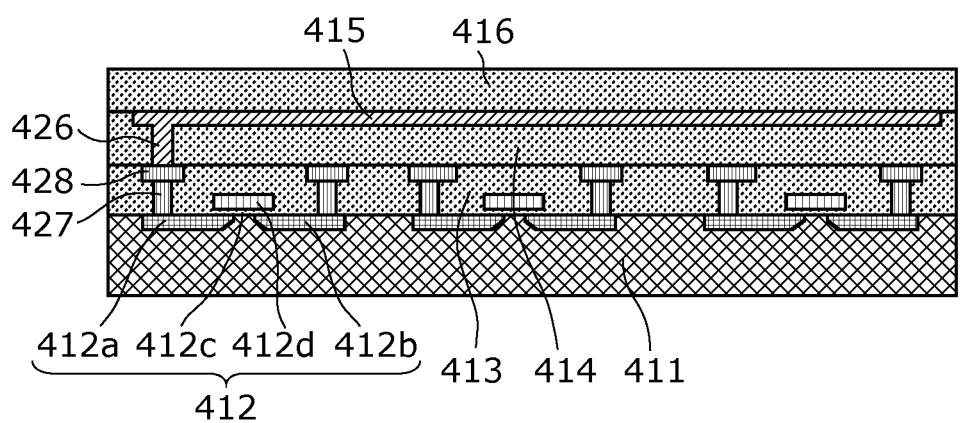
FIG. 10 is a cross-sectional view showing the state in which the lower electrode line and the interlayer dielectric are formed above a substrate in which an active element is formed, in a method for manufacturing the nonvolatile memory device according to Embodiment 3.
Figure 11A:
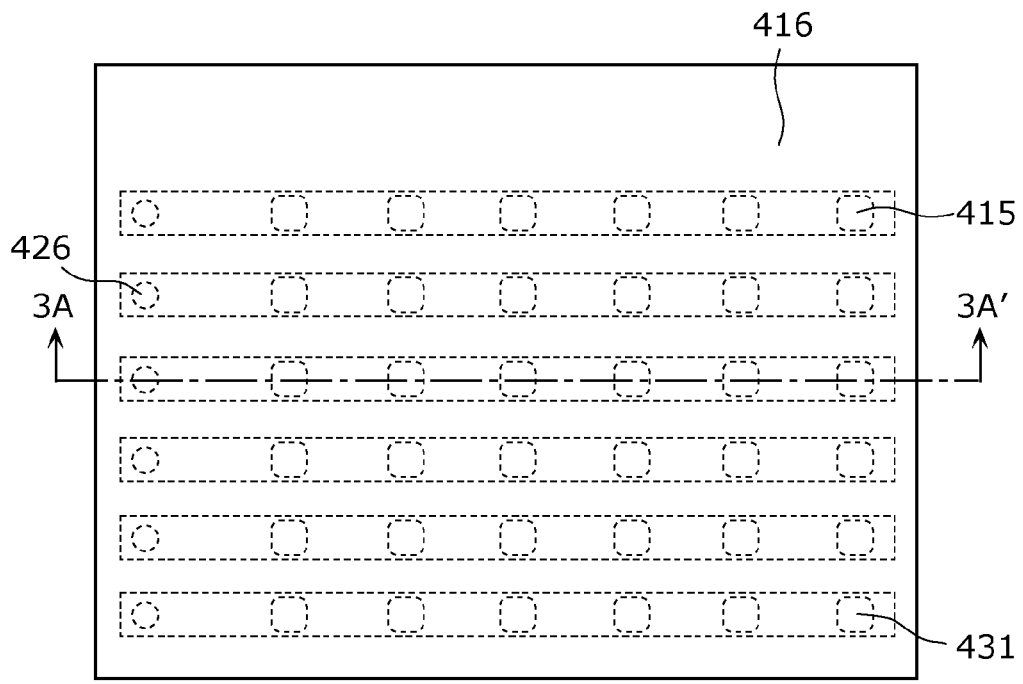
FIG. 11A is a plan view showing a state in which contact holes are formed in the interlayer dielectric, in a method for manufacturing a nonvolatile memory device according to Embodiment 3.
Figure 11B:
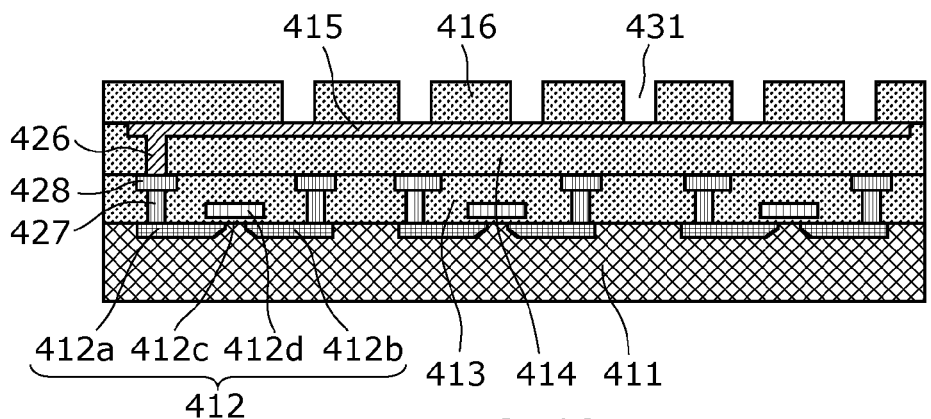
FIG. 11B is a cross-sectional view corresponding to the line 3A-3A' in FIG. 11A.

Here, FIG. 10 is a cross-sectional view showing the state in which the lower electrode line 415 and the interlayer dielectrics 414 and 416 are formed above the substrate 411 in which the active element 412 is formed. FIG. 11A is a plan view (top view) showing the state in which a contact hole 431 is formed in the interlayer dielectric 416. FIG. 11B is a cross-sectional view showing when the cross section corresponding to the line 3A-3A' of FIG. 11A is seen in an arrow direction.

Figure 12:
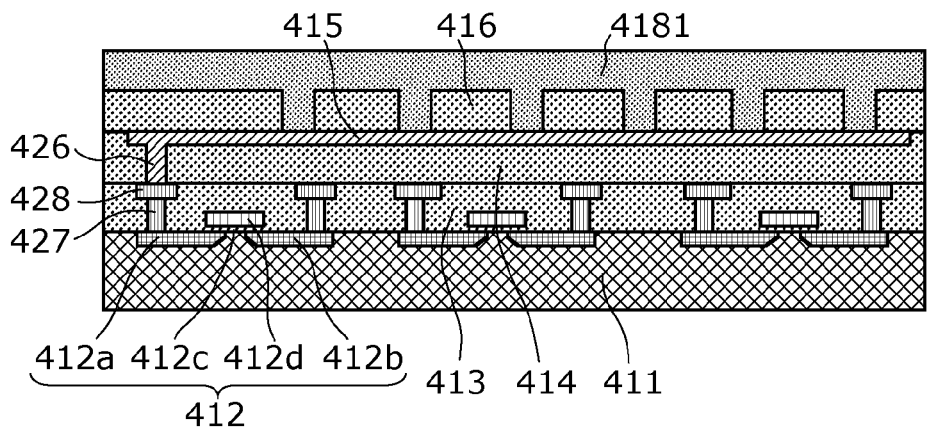
FIG. 12 is a cross-sectional view showing the state in which the lower electrode material comprised in the lower electrode layer is deposited, in a method for manufacturing the nonvolatile memory device according to Embodiment 3.

FIG. 12 is a cross-sectional view showing the state in which a lower electrode material is deposited above the contact hole 431 and the interlayer dielectric 416.

Figure 13A:
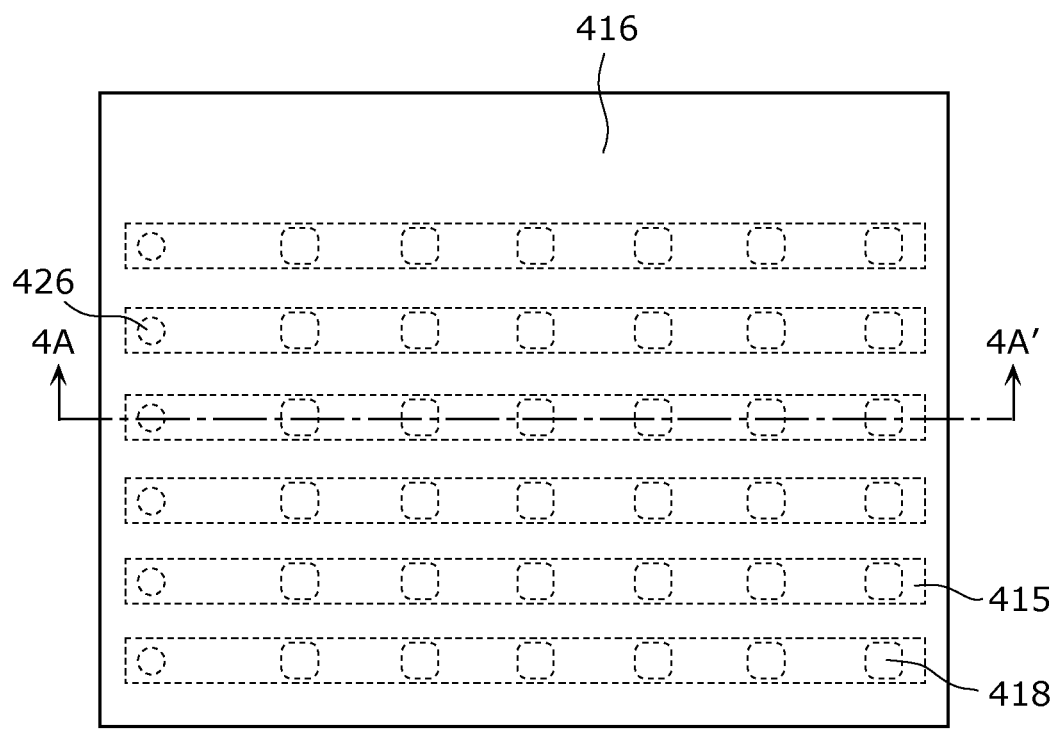
FIG. 13A is a plan view of the state in which the lower electrode layer is embedded and formed in a contact hole, in a method for manufacturing the nonvolatile memory device according to Embodiment 3.
Figure 13B:
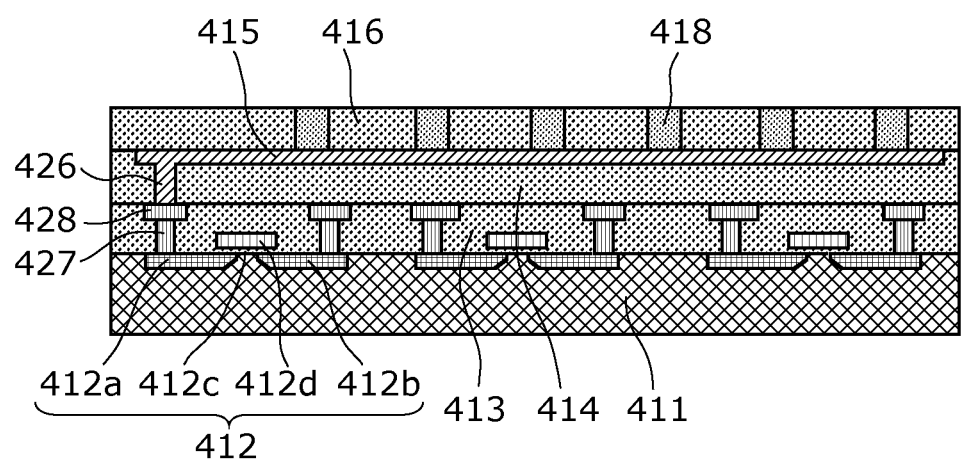
FIG. 13B is a cross-sectional view corresponding to the line 4A-4A' in FIG. 13A.
Figure 14A:
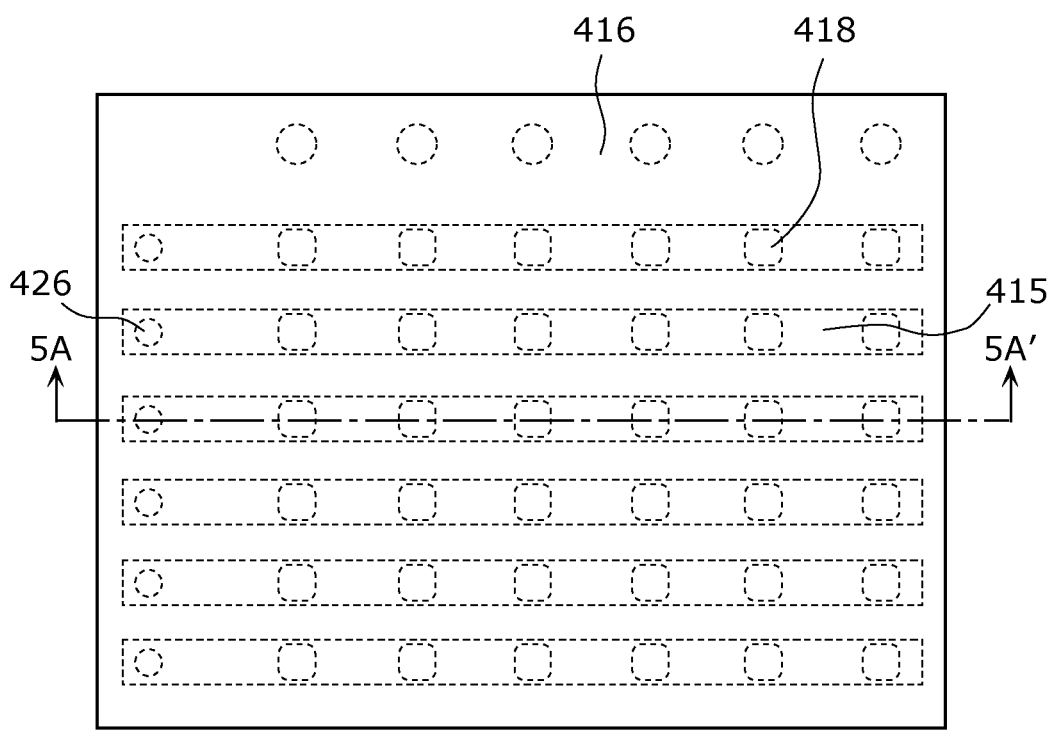
FIG. 14A is a plan view (top view) of the state in which the first metal oxide comprised in the first variable resistance layer and the second metal oxide comprised in the second variable resistance layer are successively stacked, in a method for manufacturing the nonvolatile memory device according to Embodiment 3.
Figure 14B:
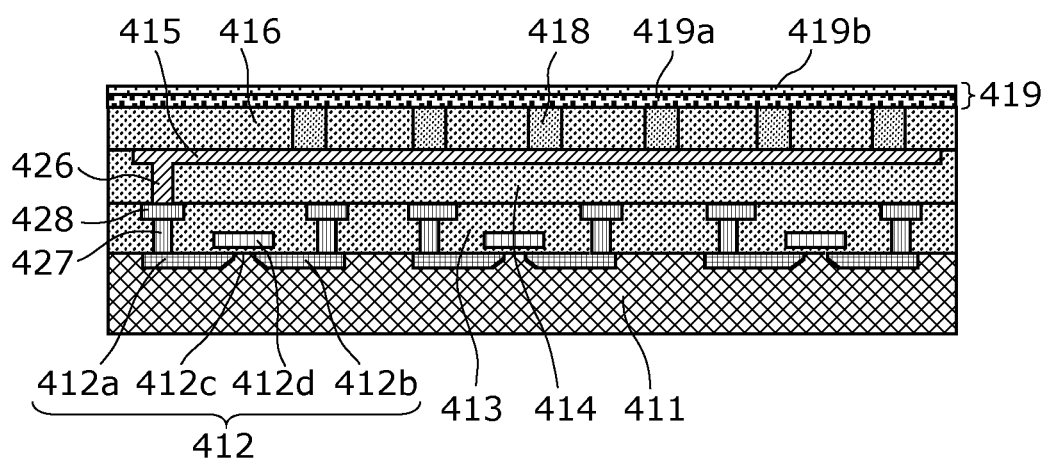
FIG. 14B is a cross-sectional view corresponding to the line 5A-5A' in FIG. 14A.
Figure 15A:
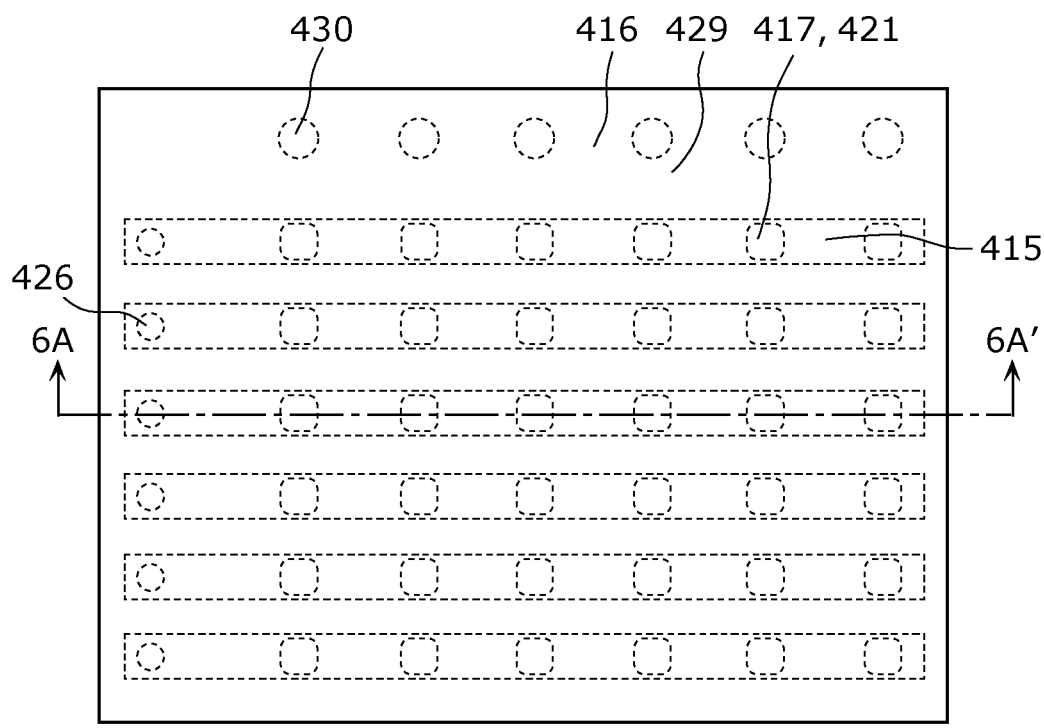
FIG. 15A is a plan view (top view) of the state in which the variable resistance element and the non-ohmic element have been formed, in a method for manufacturing the nonvolatile memory device according to Embodiment 3.
Figure 15B:
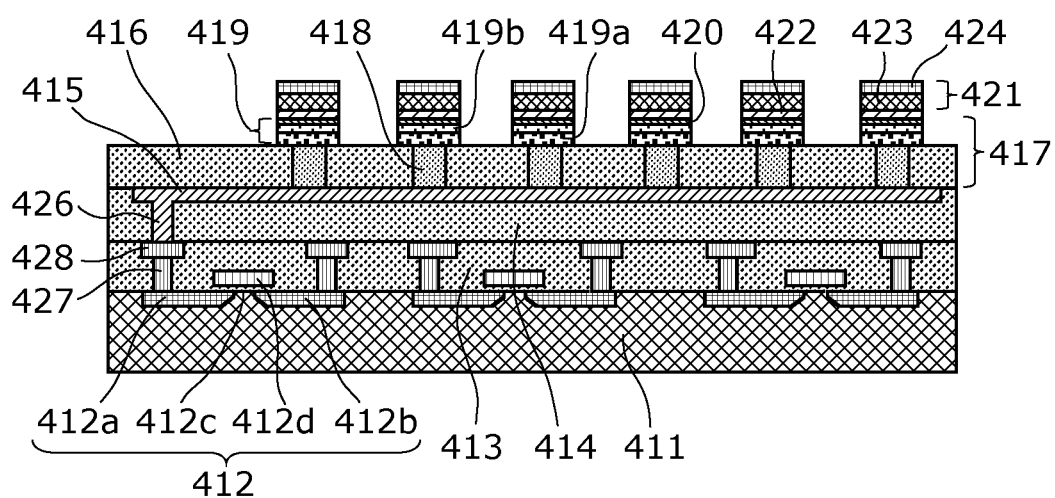
FIG. 15B is a cross-sectional view corresponding to the line 6A-6A' in FIG. 15A.

FIG. 13A, FIG. 14A, and FIG. 15A are each a plan view (top view) in a step of forming the variable resistance element and the non-ohmic element. It should be noted that FIG. 13B is a cross-sectional view when the cross section corresponding to the line 4A-4A' of FIG. 13A is seen in an arrow direction. Similarly, FIG. 14B is a cross-sectional view when the cross section corresponding to the line 5A-5A' of FIG. 14A is seen in an arrow direction. FIG. 15B is a cross-sectional view when the cross section corresponding to the line 6A-6A' of FIG. 15A is seen in an arrow direction.

First, as shown in FIG. 10, above the substrate 411 above which a plurality of the active elements 412, the embedded conductor 427, a semiconductor circuit layer comprising the semiconductor electrode line 428, the interlayer dielectric 413, and the like, the interlayer dielectric 414 is formed by depositing SiOF. In the interlayer dielectric 414, a plurality of the lower electrode lines 415 extending in a column direction (in a stripe shape) are embedded and formed (corresponding to the eighth step). Furthermore, above the lower electrode line 415 and the interlayer dielectric 414, the interlayer dielectric 416 is formed (corresponding to the ninth step).

More specifically, the lower electrode line 415 is formed, using a technique used in a general semiconductor process, a stripe-shaped groove to embed the lower electrode line 415 in the interlayer dielectric 414, and a contact hole for connecting to the semiconductor electrode line 428. By performing CMP, for example, after the stripe-shaped groove and the contact hole are formed and after a Ti—Al—N alloy material that is a line material of the lower electrode line 415 is deposited, the lower electrode line 415 shown in FIG. 10 is formed. It should be noted that the method for forming the lower electrode line 415 is not limited to such. The lower electrode line 415 may be formed by forming film by sputtering using the line material of the lower electrode line 415 and by performing photolithography process and etching process.

As shown in FIG. 10, the interlayer dielectric 416 comprising TEOS-SiO is formed, using the CVD method, above the lower electrode line 415 and the interlayer dielectric 414.

Then, as shown in FIG. 11A and FIG. 11B, using the general semiconductor process, in the interlayer dielectric 416, the contact hole 431 which reaches the lower electrode line 415 is formed at a constant array pitch (corresponding to the 10th step). It should be noted that the formation location of the contact hole 431 corresponds to a crossing of the contact hole 431 and the upper electrode line 429 to be described later. The contact hole 431, in the present embodiment, as seen from FIG. 11A, is shaped in square whose corners are rounded and in which the length of a side is smaller than the width of the lower electrode line 415. It should be noted that a planar view shape of the contact hole 431 may be any shape such as circle, ellipse, and rectangle.

Next, as shown in FIG. 12, according to the sputtering method, a tantalum nitride film 4181 is formed by depositing tantalum nitride as a lower electrode material comprised in the lower electrode layer 418 above the interlayer dielectric 416 which includes the contact hole 431.

More specifically, the tantalum nitride film 4181 is manufactured by, in a nitride gas atmosphere using Ta target, for example, in a room temperature condition, setting the chamber pressure to 0.03 [Pa] to 3 [Pa], and setting the Ar/$N_2$ flow rate to 20 [sccm]/5 [sccm] to 20 [sccm]/30 [sccm]. It should be noted that as the method for forming the tantalum nitride film 4181, not only the sputtering method but also the CVD method, the ALD method, and the like may be used.

Next, as shown in FIG. 13A and FIG. 13B, using the CMP method, by removing the tantalum nitride film 4181 other than the tantalum nitride film 4181 formed in the contact hole 431, the lower electrode layer 418 is embedded and formed in the contact hole 431 (corresponding to the first step).

Next, as shown in FIG. 14A and FIG. 14B, above the lower electrode layer 418 and the interlayer dielectric 416, $TaO_x$ film (tantalum oxide film) as an example of the first metal oxide comprised in the first variable resistance layer 419a is stacked (corresponding to the second step), and $TaO_yA_z$ film as an example of the second metal oxide comprised in the second variable resistance layer 419b is stacked (corresponding to the third step).

Specifically, first, $TaO_x$ film is deposited, according to the reactive sputtering method, above the lower electrode layer 418 and the interlayer dielectric 416. A condition for forming the $TaO_x$ film is the same as that in Embodiment 1.

Furthermore, $TaO_yA_z$ film is formed above $TaO_x$ film according to the CVD method. Here, the present embodiment assumes that carbon is the non-metal element A. A condition for forming the $TaO_yA_z$ film is the same as that in Embodiment 1.

Next, as shown in FIGS. 15A and 15B, above the $TaO_yA_z$ film, the upper electrode material comprised in the upper electrode layer 420, the first electrode material comprised in a first electrode layer 422 comprised in the non-ohmic element 421, a semiconductor material comprised in a semiconductor layer 423, the second electrode material comprised in a second electrode layer 424 are deposited in that order, and then an upper electrode material layer, a first electrode material layer, a semiconductor material layer, and a second electrode material layer are formed. Furthermore, the $TaO_x$ film, the $TaO_yC_z$ film, the upper electrode material layer, the first electrode material layer, the semiconductor material layer, and the second electrode material layer are processed into desired shapes according to a dry etching process, and then the first variable resistance layer 419a, the second variable resistance layer 419b, the upper electrode layer 420 the first electrode layer 422, the semiconductor layer 423, and the second electrode layer 424 are formed (corresponding to the fifth step to the seventh step).

More specifically, iridium film as the upper electrode material, as similarly to that in Embodiment 1, is formed according to the DC sputtering method, for example. Moreover, the first electrode material layer and the second electrode material layer, as similarly to those in Embodiment 2, are formed by stacking tantalum nitride according to the reactive sputtering method. The semiconductor material layer, as similarly to that in Embodiment 2, is formed by depositing nitrogen-deficient silicon nitride film (SiN) according to the reactive sputtering method.

Next, by depositing the interlayer dielectric 425 above the interlayer dielectric 416, the upper electrode lines 429 (shaped in stripe) each extending in a column direction are formed above the interlayer dielectric 425 and the non-ohmic element 421.

Subsequently, although not illustrated, the insulating protective layer is formed to cover the upper electrode line 429. With this, the nonvolatile memory device 400 shown in FIG. 7A can be manufactured.

As described above, although a nonvolatile memory device and a method for manufacturing the nonvolatile memory device have been described with reference to the embodiments, the present invention is not defined only by the embodiments. Those having ordinary skill in the art will appreciate that a variable resistance nonvolatile element and a method for manufacturing the variable resistance nonvolatile element realized through making various modifications in each of the embodiments and arbitrarily combining the structural elements and characteristic parts of the embodiment without materially departing from the novel teachings and advantages of the present invention. Accordingly, such modifications are included within the scope of the present invention. For example, although Embodiments 1 to 3 each show the case where the variable resistance layer is a planer type, these are mere examples. Here, although illustration is omitted, a structure is acceptable in which a memory cell hole is provided and then a variable resistance layer is embedded in the memory cell hole.

INDUSTRIAL APPLICABILITY

Since the present invention provides a variable resistance nonvolatile memory device and a nonvolatile memory device including the variable resistance nonvolatile memory device and the present invention makes it possible to decrease an initial breakdown voltage and to realize a nonvolatile memory capable of initializing at a low voltage, the present invention is useful as a variety of electronic devices using the nonvolatile memory.

REFERENCE SIGNS LIST 100, 300A, 300B, 400 Nonvolatile memory device
101, 301 Substrate
102, 206, 302 Lower electrode layer
103, 207, 303 Variable resistance layer
103a, 207a, 303a First variable resistance layer
103b, 207b, 303b Second variable resistance layer
104, 208, 304 Upper electrode layer
108, 209, 308 Variable resistance element
200 Evaluation device
201 Si wafer
202, 213 Line
203, 210 SiN film
204, 211 Contact hole
205, 212 Plug
305 First electrode layer
306 Semiconductor layer
307 Second electrode layer
309, 421 Non-ohmic element
405 Word line decoder
406 Bit line decoder
407 Read circuit
411 Substrate
412 Active element
412a Source region
412b Drain region
412c Gate insulating film
412d Gate electrode
413, 414 Interlayer dielectric
415 Lower electrode line
416 Interlayer dielectric
417 Variable resistance element
418 Lower electrode layer
419 Variable resistance layer
419a First variable resistance layer
419b Second variable resistance layer
420 Upper electrode layer
422 First electrode layer
423 Semiconductor layer
424 Second electrode layer
425 Interlayer dielectric
426, 427 Embedded conductor
428 Semiconductor electrode line
429 Upper electrode line
430 Embedded conductor
431 Contact hole

The invention claimed is:

1. A nonvolatile memory device comprising
a variable resistance element which includes:
an upper electrode layer;
a lower electrode layer; and
a variable resistance layer which is between the upper electrode layer and the lower electrode layer and has a resistance state which reversibly changes based on an electric pulse applied to between the upper electrode layer and the lower electrode layer and is maintained after the change,
wherein the variable resistance layer includes a first variable resistance layer comprising a first metal oxide that is oxygen deficient and a second variable resistance layer comprising a second metal oxide having a degree of oxygen deficiency that is different from a degree of oxygen deficiency of the first metal oxide,
the second variable resistance layer includes a non-metal element that is A and is different from oxygen,
$x<(y+z)$ is satisfied where a first metal comprised in the first metal oxide is M, a second metal comprised in the second metal oxide is N, a composition of the first variable resistance layer is represented by $MO_x$, and a composition of the second variable resistance layer is represented by $NO_yA_z$,
the second variable resistance layer has a higher resistivity than a resistivity of the first variable resistance layer, and
a film density of the second variable resistance layer is lower than a theoretical film density of the second metal oxide which has a stoichiometric composition.

2. The nonvolatile memory device according to claim 1, wherein the non-metal element has a larger atomic radius than an atomic radius of oxygen.

3. The nonvolatile memory device according to claim 1, wherein the non-metal element has a smaller atomic weight than an atomic weight of oxygen.

4. The nonvolatile memory device according to claim 1, wherein the non-metal element is any one of boron, nitrogen, and carbon.

5. The nonvolatile memory device according to claim 1, wherein the non-metal element is carbon, and a carbon content atomic percentage of the second variable resistance layer is no less than 2 [atm %] and no more than 45 [atm %].

6. The nonvolatile memory device according to claim 1, wherein the first metal oxide is a transition metal oxide or an aluminum oxide.

7. The nonvolatile memory device according to claim 6, wherein the first metal oxide is a tantalum oxide.

8. The nonvolatile memory device according to claim 7, wherein the second variable resistance layer has a film density of no less than 4 [g/cm$^3$] and no more than 7 [g/cm$^3$].

9. The nonvolatile memory device according to claim 1, wherein the first metal and the second metal are a same metal.

10. The nonvolatile memory device according to claim 1, wherein the first metal and the second metal are different metals.

11. The nonvolatile memory device according to claim 1, further comprising
a non-ohmic element which includes a first electrode layer, a semiconductor layer formed above the first electrode layer, and a second electrode layer formed above the semiconductor layer,
wherein the lower electrode layer or the upper electrode layer of the variable resistance element is in direct contact with the first electrode layer or the second electrode layer of the non-ohmic element.

12. A method for manufacturing a nonvolatile memory device which includes a variable resistance element which includes a variable resistance layer in which a resistance state changes according to application of an electric pulse and the changed resistance state is maintained, the method comprising
forming an element which includes:
(a) forming a lower electrode layer;
forming the variable resistance layer above the lower electrode layer; and
(d) forming an upper electrode layer above the variable resistance layer,
wherein the forming of the variable resistance layer includes: (b) forming a first variable resistance layer comprising a first metal oxide that is oxygen deficient; and (c) forming a second variable resistance layer which comprises a second metal oxide having a degree of oxygen deficiency that is different from a degree of oxygen deficiency of the first metal oxide, includes a non-metal element that is A and is different from oxygen, satisfies x<(y+z) where a first metal comprised in the first metal oxide is M, a second metal comprised in the second metal oxide is N, a composition of the first variable resistance layer is represented by MO$_x$, and a composition of the second variable resistance layer is represented by NO$_y$A$_z$, has a higher resistivity than a resistivity of the first variable resistance layer, and has a film density lower than a theoretical film density of the second metal oxide which has a stoichiometric composition.

13. The method for manufacturing a nonvolatile memory device according to claim 12, further comprising
forming a non-ohmic element which includes:
(e) forming a first electrode layer;
(f) forming a semiconductor layer or an insulating layer above the first electrode layer; and
(g) forming a second electrode layer above the semiconductor layer or the insulating layer,
wherein the forming of a non-ohmic element is performed before or after the forming of an element.

14. The method for manufacturing a nonvolatile memory device according to claim 12, further comprising
preprocessing which includes:
(h) forming a plurality of lower electrode lines extending in a first direction;
(i) forming an interlayer dielectric above the lower electrode lines; and
(j) forming contact holes each of which reaches one of the lower electrode lines, the contact holes each being at a location which is in the interlayer dielectric and corresponds to one of crossings of a plurality of upper electrode lines extending in a second direction crossing the first direction and the lower electrode lines,
wherein after the preprocessing, the lower electrode layer of the variable resistance element is embedded and formed in the contact hole.

15. The method for manufacturing a nonvolatile memory device according to claim 12,
wherein in step (c), the second variable resistance layer is formed according to a CVD method or an ALD method.

16. The method for manufacturing a nonvolatile memory device according to claim 12,
wherein the first metal and the second metal are a same metal.

17. The method for manufacturing a nonvolatile memory device according to claim 12,
wherein the first metal and the second metal are different metals.

* * * * *